United States Patent
Kurokawa

(10) Patent No.: US 9,438,207 B2
(45) Date of Patent: Sep. 6, 2016

(54) SEMICONDUCTOR DEVICE, ELECTRONIC COMPONENT, AND ELECTRONIC DEVICE

(71) Applicant: Semiconductor Energy Laboratory Co., Ltd., Atsugi-shi, Kanagawa-ken (JP)

(72) Inventor: Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/882,816

(22) Filed: Oct. 14, 2015

(65) Prior Publication Data

US 2016/0112035 A1    Apr. 21, 2016

(30) Foreign Application Priority Data

Oct. 17, 2014  (JP) ................................. 2014-212710
Oct. 17, 2014  (JP) ................................. 2014-212807

(51) Int. Cl.

| | |
|---|---|
| G06F 7/38 | (2006.01) |
| H03K 19/173 | (2006.01) |
| H03K 3/012 | (2006.01) |
| H01L 29/786 | (2006.01) |
| H03K 19/0944 | (2006.01) |
| H03K 3/86 | (2006.01) |
| H03K 3/356 | (2006.01) |

(52) U.S. Cl.
CPC ........... *H03K 3/012* (2013.01); *H01L 29/7869* (2013.01); *H03K 3/356* (2013.01); *H03K 3/86* (2013.01); *H03K 19/09441* (2013.01)

(58) Field of Classification Search
None
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,501,677 B1 * | 12/2002 | Rau et al. .......... | H03K 19/1776 365/154 |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(Continued)

*Primary Examiner* — Anh Tran
(74) *Attorney, Agent, or Firm* — Fish & Richardson P.C.

(57) ABSTRACT

A semiconductor device includes a logic circuit capable of storing configuration data. The logic circuit includes a latch circuit, an arithmetic circuit, a delay circuit, and a first output timing generation circuit. The latch circuit has a function of receiving a pulse signal and a reset signal and outputting a first signal. The delay circuit has a function of receiving the first signal and outputting a second signal. The first signal controls power supply to the arithmetic circuit and the delay circuit. The second signal is obtained by delaying the first signal so as to correspond to a delay in a critical path of the arithmetic circuit. The first output timing generation circuit has a function of receiving a third signal obtained by a logical operation on the first signal and the second signal and outputting the reset signal.

12 Claims, 24 Drawing Sheets

(56) References Cited

U.S. PATENT DOCUMENTS

| | | | |
|---|---|---|---|
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,088,136 B1* | 8/2006 | Lewis | H03K 19/17792 326/38 |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,970,251 B2 | 3/2015 | Kurokawa | |
| 9,007,093 B2 | 4/2015 | Kurokawa et al. | |
| 9,065,438 B2 | 6/2015 | Aoki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0143383 A1* | 6/2008 | Wong | G06F 1/10 326/46 |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2013/0285697 A1 | 10/2013 | Kurokawa | |
| 2013/0293263 A1 | 11/2013 | Kurokawa | |
| 2013/0314124 A1 | 11/2013 | Ikeda et al. | |
| 2013/0321025 A1 | 12/2013 | Kurokawa et al. | |
| 2014/0159771 A1 | 6/2014 | Ikeda et al. | |
| 2015/0171865 A1 | 6/2015 | Kurokawa | |
| 2015/0222269 A1 | 8/2015 | Kurokawa et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2013-243657 A | 12/2013 |
| JP | 2013-251894 A | 12/2013 |
| JP | 2014-007737 A | 1/2014 |
| JP | 2014-158250 A | 8/2014 |
| JP | 2015-027080 A | 2/2015 |
| JP | 2015-080187 A | 4/2015 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and its Blue Phase", Phys. Rev. A (Physical Review. A), May 1, 1984, vol. 29, No. 5, pp. 2957-2959.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

(56) References Cited

OTHER PUBLICATIONS

Kitzerow.H et al., "Observation of Blue Phases in Chiral Networks", Liquid Crystals, 1993, vol. 14, No. 3, pp. 911-916.
Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Kikuchi.H et al., "Polymer-Stabilized Liquid Crystal Blue Phases", Nature Materials, Sep. 2, 2002, vol. 1, pp. 64-68.
Tsuda.K et al., "Ultra Low Power Consumption Technologies for Mobile TFT-LCDs", IDW '02 : Proceedings of the 9th International Display Workshops, Dec. 4, 2002, pp. 295-298.
Nomura.K et al., "Thin-Film Transistor Fabricated in Single-Crystalline Transparent Oxide Semiconductor", Science, May 23, 2003, vol. 300, No. 5623, pp. 1269-1272.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Lee.H et al., "Current Status of, Challenges to, and Perspective View of AM-OLED", IDW '06 : Proceedings of the 13th International Display Workshops, Dec. 7, 2006, pp. 663-666.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Park.S et al., "Challenge to Future Displays: Transparent AM-OLED Driven by PEALD Grown ZnO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07: SID International Symposium Digest of Technical Papers, 2007, vol. 38, pp. 1737-1740.
Miyasaka.M, "SUFTLA Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits , 2008, vol. 43, No. 1, pp. 292-299.
Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.
Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.
Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev.B (Physical Review. B), Jan. 15, 2000, vol. 61, No. 3, pp. 1811-1816.

(56) References Cited

OTHER PUBLICATIONS

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

\* cited by examiner

106

SEMICONDUCTOR DEVICE, ELECTRONIC COMPONENT, AND ELECTRONIC DEVICE

BACKGROUND OF THE INVENTION

1. Field of the Invention

One embodiment of the present invention relates to a semiconductor device, an electronic component, and an electronic device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, an imaging device, a memory device, a method for driving any of them, and a method for manufacturing any of them.

In this specification and the like, a semiconductor device refers to an element, a circuit, a device, or the like that can function by utilizing semiconductor characteristics. An example of the semiconductor device is a semiconductor element such as a transistor or a diode. Another example of the semiconductor device is a circuit including a semiconductor element. Another example of the semiconductor device is a device provided with a circuit including a semiconductor element.

2. Description of the Related Art

Semiconductor devices have been proposed which include transistors containing an oxide semiconductor in channel formation regions (hereinafter also referred to as OS transistors) and which function as reconfigurable circuits (see Patent Documents 1 to 4).

OS transistors are utilized for a configuration memory which stores configuration data. This makes it easy to decrease the area of the configuration memory and increase the degree of integration of the configuration memory. Accordingly, it becomes easy to configure a multi-context configuration memory in which configuration data can be rewritten during operation. Furthermore, the switching speed of a routing switch can be expected to be increased by a boosting effect.

REFERENCES

[Patent Document 1] United States Patent Application Publication No. 2013/0285697
[Patent Document 2] United States Patent Application Publication No. 2013/0293263
[Patent Document 3] United States Patent Application Publication No. 2013/0314124
[Patent Document 4] United States Patent Application Publication No. 2013/0321025

SUMMARY OF THE INVENTION

A synchronous circuit is employed as a logic circuit which is included in a semiconductor device and which is capable of storing configuration data. Since the synchronous circuit uses a global clock signal, the synchronous circuit has problems such as a huge amount of power consumption required for distribution of the global clock signal and instantaneous flow of a large amount of current.

In addition, the performance of the whole synchronous circuit is determined by a signal path which limits circuit operation, i.e., a critical path, and this leads to pessimistic performance estimation in designing. In other words, the performance is estimated in designing with a long period of the global clock signal. Therefore, in a configuration where power gating is implemented for each logic circuit, power gating needs to be implemented after the period of the global clock signal even for a logic circuit which has completed an operation. This means that power consumption cannot be effectively reduced by power gating.

In an asynchronous circuit which does not use a global clock signal, a signal is sequentially transmitted to circuits. In that case, signals are exchanged between logic circuits by a handshaking method. The handshaking method refers to a method for exchanging data signals between a signal sender and a signal receiver by exchanging a request signal and an acknowledgement signal. In the case where the handshaking method is applied to a semiconductor device which functions as a reconfigurable circuit, wirings for request and acknowledgement signals are required in addition to wirings for data signals, which is disadvantageous because a large number of wirings are needed, for example.

A logic circuit is desired which is capable of switching between an asynchronous circuit and a synchronous circuit or capable of flexible circuit reconfiguration regardless of whether its input signal is a pulse signal or a binary signal.

An object of one embodiment of the present invention is to provide a novel semiconductor device, a novel electronic device, or the like.

Another object of one embodiment of the present invention is to provide a semiconductor device or the like with a novel structure, in which the number of wirings between circuits is reduced. Another object of one embodiment of the present invention is to provide a semiconductor device or the like with a novel structure, in which power consumption is reduced.

Note that the objects of one embodiment of the present invention are not limited to the above objects. The objects described above do not disturb the existence of other objects. The other objects are ones that are not described above and will be described below. The other objects will be apparent from and can be derived from the description of the specification, the drawings, and the like by those skilled in the art. One embodiment of the present invention solves at least one of the above objects and the other objects.

One embodiment of the present invention is a semiconductor device including a logic circuit capable of storing configuration data. The logic circuit includes latch circuits, an arithmetic circuit, a delay circuit, and an output timing generation circuit. Each of the latch circuits is capable of receiving a pulse signal from an adjacent logic circuit and outputting a first signal and a second signal. A third signal obtained by a logical operation on the first signals controls power supply to the arithmetic circuit and the delay circuit. The arithmetic circuit is capable of receiving the second signals and outputting a fourth signal. The second signal is obtained by delaying the first signal in each of the latch circuits. The delay circuit is capable of receiving the third signal and outputting a fifth signal. The fifth signal is obtained by delaying the third signal so as to correspond to a delay in a critical path of the arithmetic circuit. The output timing generation circuit is capable of receiving a sixth signal obtained by a logical operation on the third signal and the fifth signal and resetting the latch circuits.

One embodiment of the present invention is a semiconductor device including a logic circuit capable of storing configuration data. The logic circuit includes latch circuits, multiplexers, an arithmetic circuit, a delay circuit, and an output timing generation circuit. Each of the latch circuits is capable of receiving a pulse signal from an adjacent logic circuit and outputting a first signal and a second signal. A third signal obtained by a logical operation on the first signals controls power supply to the arithmetic circuit and the delay circuit. Each of the multiplexers is capable of receiving each of the second signals and a binary data signal from an adjacent logic circuit and outputting the second signal or the binary data signal to the arithmetic circuit. The second signal is obtained by delaying the first signal in each of the latch circuits. The arithmetic circuit is capable of receiving the second signal or the binary data signal and outputting a fourth signal. The delay circuit is capable of receiving the third signal and outputting a fifth signal. The fifth signal is obtained by delaying the third signal so as to correspond to a delay in a critical path of the arithmetic circuit. The output timing generation circuit is capable of receiving a sixth signal obtained by a logical operation on the third signal and the fifth signal and resetting the latch circuits.

In one embodiment of the present invention, it is preferable that the logic circuit include a register and an output signal generation circuit; the output timing generation circuit be capable of outputting a seventh signal, an eighth signal, and a ninth signal; the register be capable of receiving the fourth signal from the logic circuit and outputting the fourth signal to the output signal generation circuit according to the seventh signal; and the output signal generation circuit be capable of outputting the fourth signal to an adjacent logic circuit according to the eighth signal and the ninth signal.

In the semiconductor device of one embodiment of the present invention, it is preferable that the arithmetic circuit be capable of switching functions in accordance with the configuration data.

In the semiconductor device of one embodiment of the present invention, it is preferable that the configuration data be stored in a memory circuit which includes a transistor containing an oxide semiconductor in a channel formation region.

Note that other embodiments of the present invention will be shown in the following embodiments and the drawings.

One embodiment of the present invention can provide a novel semiconductor device, a novel electronic device, or the like.

Another embodiment of the present invention can provide a semiconductor device or the like with a novel structure, in which the number of wirings between circuits is reduced. Another embodiment of the present invention can provide a semiconductor device or the like with a novel structure, in which power consumption is reduced. Another embodiment of the present invention can provide a semiconductor device or the like with a novel structure, in which circuit reconfiguration based on an input or output signal is achieved.

Note that the effects of one embodiment of the present invention are not limited to the above effects. The effects described above do not disturb the existence of other effects. The other effects are ones that are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have the aforementioned effects in some cases.

DETAILED DESCRIPTION OF THE INVENTION

Figure 1:
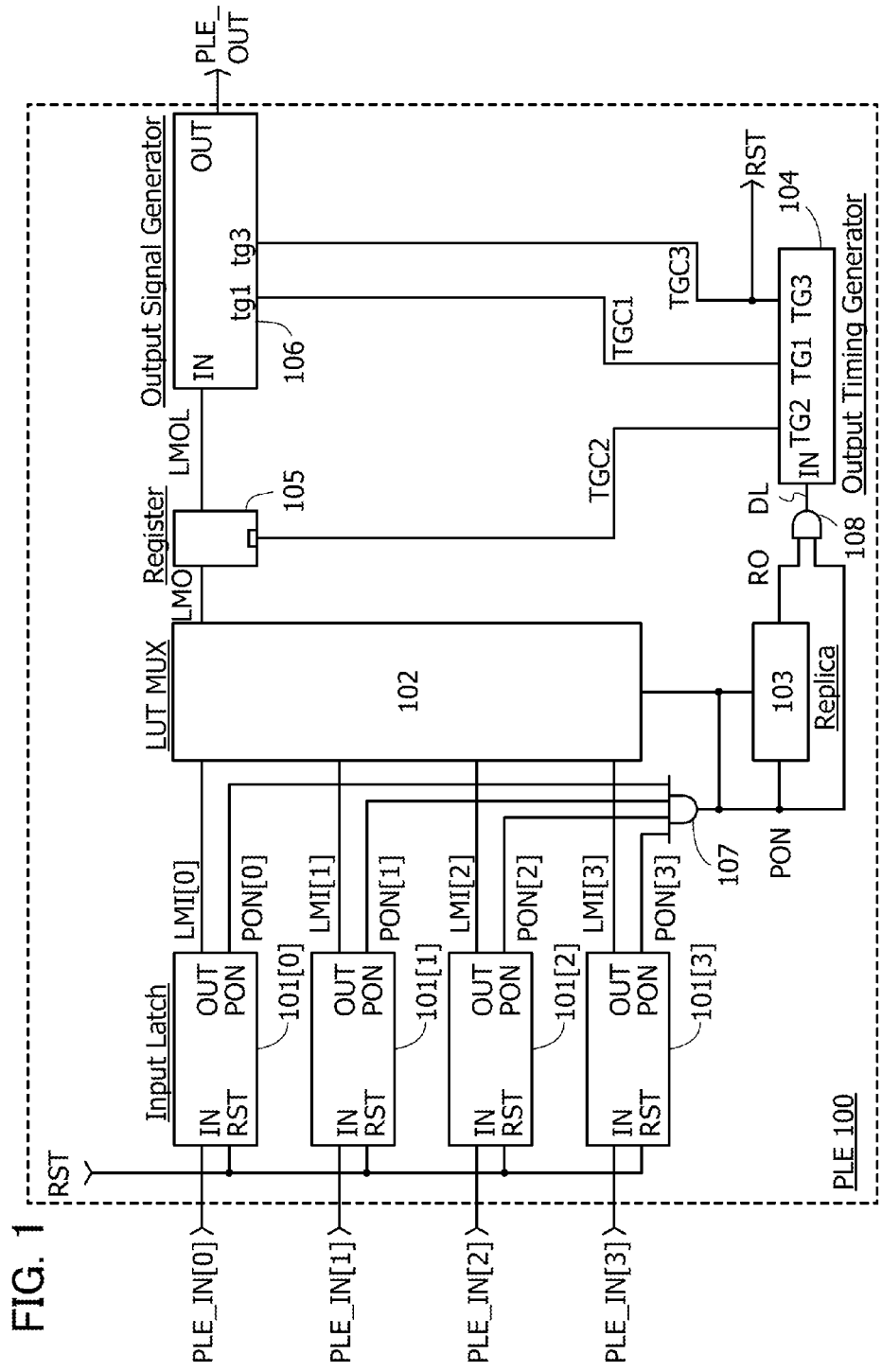
FIG. 1 is a block diagram illustrating one embodiment of the present invention.

Embodiments will be hereinafter described with reference to drawings. Note that embodiments can be carried out in many different modes, and it is easily understood by those skilled in the art that modes and details of the present invention can be modified in various ways without departing from the spirit and the scope of the present invention. Therefore, the present invention should not be interpreted as being limited to the description in the following embodiments.

Note that ordinal numbers such as "first", "second", and "third" in this specification and the like are used in order to avoid confusion among components. Thus, the terms do not limit the number or order of components. For example, in the present specification and the like, a "first" component in one embodiment can be referred to as a "second" component in other embodiments or claims. Furthermore, in the present specification and the like, a "first" component in one embodiment can be referred to without the ordinal number in other embodiments or claims.

The same elements or elements having similar functions, elements formed using the same material, elements formed at the same time, or the like in the drawings are denoted by the same reference numerals in some cases, and the description thereof is not repeated in some cases.

Embodiment 1

A configuration of a semiconductor device of one embodiment of the present invention will be described with reference to FIG. 1.

In this specification and the like, the term "semiconductor device" refers to all devices that have semiconductor characteristics. Alternatively, the term "semiconductor device" may refer to a circuit utilizing semiconductor characteristics or the whole system that includes the circuit.

FIG. 1 is a block diagram illustrating the configuration of the semiconductor device in one embodiment of the present invention.

A semiconductor device 100 illustrated in FIG. 1 has a function of a logic circuit capable of storing configuration data. The semiconductor device 100 functions as a reconfigurable logic circuit. In some cases, the semiconductor device 100 is referred to as a programmable logic element (PLE).

The semiconductor device 100 includes latch circuits 101[0] to 101[3], an arithmetic circuit 102, a delay circuit 103, an output timing generation circuit 104, a register 105, an output signal generation circuit 106, an AND gate 107, and an AND gate 108.

The semiconductor device 100 illustrated in FIG. 1 is capable of receiving and outputting input data without using a global clock signal. Therefore, power is not consumed for distribution of a global clock signal, leading to low power consumption.

In the semiconductor device 100 in FIG. 1, power gating of the arithmetic circuit 102 and the delay circuit 103 can be implemented without the need to wait for the period of a global clock signal. Therefore, power gating can be implemented sequentially from a circuit which has completed arithmetic processing; thus, power consumption can be effectively reduced by power gating.

The semiconductor device 100 in FIG. 1 can be used as an asynchronous circuit where a global clock signal is not used and a signal is sequentially transmitted from one circuit to another. Accordingly, the semiconductor device 100 in FIG. 1 can exchange signals with other logic circuits without using a handshaking method. Therefore, there is no need to provide wirings for a handshaking method between circuits, which enables the number of wirings to be reduced.

Components and operation of the semiconductor device 100 and circuit examples of the components will be described below.
<Components of Semiconductor Device>
The latch circuits 101 [0] to 101[3] have a function of generating signals PON[0] to PON[3] for powering on the arithmetic circuit 102 and the delay circuit 103 when receiving signals PLE_IN[0] to PLE_IN[3] which are pulse signals output from other semiconductor devices. The latch circuits 101[0] to 101[3] also have a function of determining logical values ("0" or "1") of signals output from the other semiconductor devices by using the input pulse signals, and outputting data signals LMI[0] to LMI[3] to the arithmetic circuit 102 accordingly. The latch circuits 101[0] to 101[3] also have a function of being initialized by the input of a reset signal RST. The latch circuits 101[0] to 101[3] include RS latches and can output the signals PON[0] to PON[3] which are delayed for certain periods of time from the inputs of the signals PLE_N[0] to PLE_IN[3]. Further, the latch circuits 101[0] to 101[3] can output the data signals LMI[0] to LMI[3] which are delayed for further certain periods of time from the signals PON[0] to PON[3].

Although FIG. 1 illustrates four latch circuits, i.e., the latch circuits 101[0] to 101[3], the number of latch circuits is not limited thereto. For example, the number of latch circuits may correspond to the number of signals PLE_IN. Note that latch circuits may be referred to as input latches.

Note that the signals PLE_IN[0] to PLE_IN[3] have a pulsed waveform (pulses) and may be referred to as pulse signals.

The arithmetic circuit 102 has a function of conducting arithmetic processing based on the data signals LMI[0] to LMI[3] and outputting a signal LMO. The arithmetic circuit 102 can conduct arithmetic processing based on configuration data. Arithmetic processing conducted by the arithmetic circuit 102 can be changed by a change in configuration data; thus, a semiconductor device including a reconfigurable circuit can be obtained. The arithmetic circuit 102 includes a lookup table (LUT) and a multiplexer (MUX), and also includes a configuration memory for storing configuration data.

The detailed configuration of the configuration memory will be described below. The configuration memory preferably includes a nonvolatile memory element. By including a nonvolatile memory element, the configuration memory can keep storing configuration data even when power gating of the arithmetic circuit 102 is implemented. Therefore, configuration data rewriting is not necessary when the arithmetic circuit 102 returns from power gating to normal operation. Thus, the corresponding power can be saved, leading to low power consumption.

The AND gate 107 has a function of generating a signal PON by conducting a logical operation, here an AND operation, on the signals PON[0] to PON[3]. The signal PON has a function of powering on the arithmetic circuit 102 and the delay circuit 103.

The AND gate 107 can generate the signal PON for powering on the arithmetic circuit 102 and the delay circuit 103 after the signals PLE_IN[0] to PLE_IN[3] arrive at the latch circuits 101[0] to 101[3]. Therefore, the arithmetic circuit 102 and the delay circuit 103 can be powered off until the arrival of all the signals PLE_IN[0] to PLE_IN[3], and can be powered on shortly before the operation of the circuits. Accordingly, power gating operation can be carried out to enable more efficient power supply.

The delay circuit 103 has a function of generating a signal RO after a period of time corresponding to a delay time in a critical path of the arithmetic circuit 102 passes from the input of the signal PON. Note that the delay circuit 103 includes a circuit for causing a delay comparable to that in the critical path of the arithmetic circuit 102 and may be referred to as a replica.

The AND gate 108 has a function of generating a signal DL by conducting an AND operation on the signal PON and the signal RO. The signal DL is input to the output timing generation circuit 104.

The AND gate 108 can generate the signal DL which indicates the completion of operation for the signal LMO by the arithmetic circuit 102. The signal DL is at a high level when both the signal PON and the signal RO are at a high level, i.e., when the signal RO is generated after the delay time corresponding to the delay in the critical path of the arithmetic circuit 102 passes after the generation of the signal PON by the AND gate 107. In other words, the signal DL is generated when the operation by the arithmetic circuit 102 is completed and the signal LMO is fixed. Therefore, the completion of the operation by the arithmetic circuit 102 can be immediately known from the signal DL. In addition, the signal DL can be utilized to generate a timing signal for power gating of the arithmetic circuit 102 and a plurality of timing signals for outputting the above operation result as an output signal of the semiconductor device 100. For example, the output timing generation circuit 104, to which the signal DL is input, can generate the reset signal RST and the like and can power off the arithmetic circuit 102 and the delay circuit 103 shortly after the completion of their operations. Accordingly, power gating operation can be carried out to enable efficient power supply.

The output timing generation circuit 104 has a function of receiving the signal DL and generating signals TGC1 to TGC3. Note that the output timing generation circuit 104 may be referred to as an output timing generator. The output timing generation circuit 104 includes RS latches and can output the signals TGC1 to TGC3 which are delayed for certain periods of time from the input of the signal DL. The output timing generation circuit 104 can output the signal TGC1 which is generated with a delay for a certain period of time from the input of the signal DL, the signal TGC2 which is generated with a further delay for the certain period of time, and the signal TGC3 which is generated with a still further delay for the certain period of time.

The register 105 has a function of latching the signal LMO and outputting the latched signal as a signal LMOL under control of the signal TGC2. Owing to the register 105, the signal LMO stored therein can be output as the signal LMOL at a predetermined time even during the power gating of the arithmetic circuit 102.

The output signal generation circuit 106 has a function of receiving the signal LMOL and outputting a signal PLE_OUT based on a logical value of the signal LMOL at the time when the signal TGC1 and the signal TGC3 are set at a high level. Note that the output signal generation circuit 106 may be referred to as an output signal generator. The output signal generation circuit 106 can change the logical value of the signal PLE_OUT by outputting a pulse at the time when the signal TGC1 is set at the high level and then outputting a pulse based on the logical value of the signal LMOL at the time when the signal TGC3 is set at the high level.

<Operation of Semiconductor Device>

Figure 2:
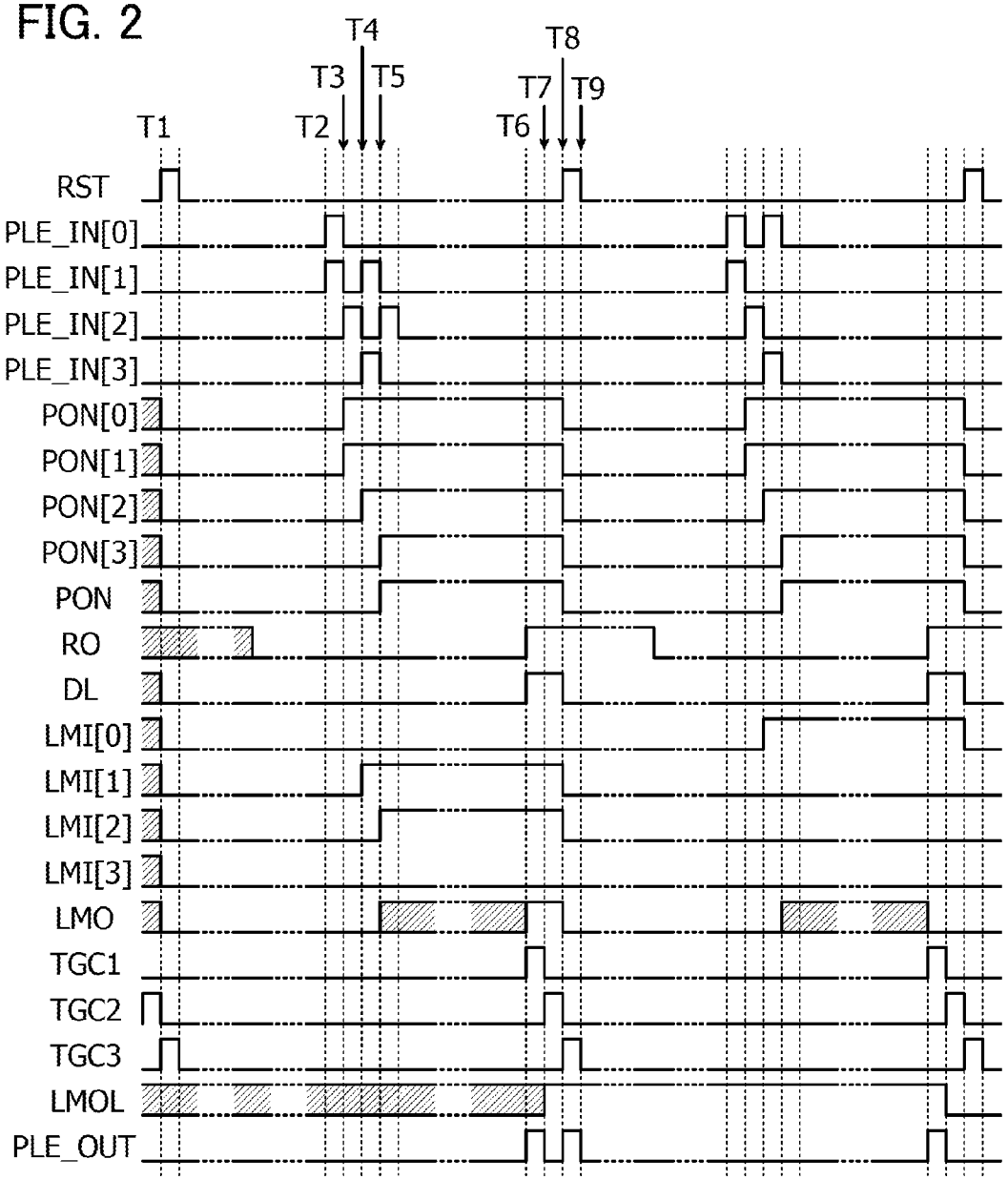
FIG. 2 is a timing chart illustrating one embodiment of the present invention.

FIG. 2 is a timing chart illustrating each signal in the semiconductor device 100 illustrated in FIG. 1. Note that data "0" of each of the signals PLE_IN[0] to PLE_IN[3] is represented by one pulse, and data "1" thereof is represented by two pulses. Note that the term "pulse" refers to a signal whose potential changes in a short period, e.g., a signal whose potential is changed from a low level to a high level and again to the low level.

At time T1, the signal RST is set at a high level. At that time, the signals PON[0] to PON[3] output from the latch circuits 101[0] to 101[3] are at a low level, and the signal PON is also at a low level. Accordingly, the arithmetic circuit 102 and the delay circuit 103 are powered off.

At time T2, the signal PLE_IN[0] is set at a high level, and the signal PLE_IN[1] is set at a high level. This means the input of a first pulse of each of the signals PLE_IN[0] and PLE_IN[1]. Then, at time T3, the signal PLE_IN[0] is set at the low level, and the signal PLE_IN[1] is set at the low level. This means the end of the input of the first pulse of each of the signals PLE_IN[0] and PLE_IN[1]. At that time, the signal PON[0] is at a high level, and the signal PON[1] is at a high level.

At time T3, the signal PLE_IN[2] is set at a high level. This means the input of a first pulse of the signal PLE_IN[2]. Then, at time T4, the signal PLE_IN[2] is set at the low level. This means the end of the input of the first pulse of the signal PLE_IN[2]. At that time, the signal PON[2] is at a high level.

At time T4, the signal PLE_IN[3] is set at a high level. This means the input of a first pulse of the signal PLE_IN[3]. Then, at time T5, the signal PLE_IN[3] is set at the low level. This means the end of the input of the first pulse of the signal PLE_IN[3]. At that time, the signal PON[3] is at a high level. In addition, the signal PON is at a high level, and accordingly, the arithmetic circuit 102 and the delay circuit 103 are powered on.

That is, with the use of pulse signals as the signals PLE_IN[0] to PLE_IN[3], signal reception can be determined, and power supply to the arithmetic circuit 102 and the delay circuit 103 can be controlled. Accordingly, the arithmetic circuit 102 and the delay circuit 103 can be powered off until the signal reception and thus can be powered off for a long period. Furthermore, since a circuit for a handshaking method is not used, a control signal for a handshaking method is not needed, which enables the number of wirings to be reduced.

Note that the signal PLE_IN[1] is set at the high level at time T4, and the signal PLE_IN[2] is set at the high level at time T5. This means that a second pulse of each of the signals PLE_IN[1] and PLE_IN[2] is input, and that the data of the input signal has the logical value "1". On the other hand, a second pulse of each of the signals PLE_IN[0] and PLE_IN[3] is not input, which means that the data of the input signal has the logical value "0". That is, the signals PLE_IN[0] to PLE_IN[3] having data "0", "1", "1", and "0", respectively, are input.

When the signal PON is at the high level at time T5 and accordingly the arithmetic circuit 102 and the delay circuit 103 are powered on, the signal RO output from the delay circuit 103 is changed from the low level to the high level with a certain period of delay at time T6. At that time, the value of the signal LMO is fixed. In FIG. 2, the fixed value of the signal LMO is the high level. In addition, since the signal RO is at the high level, the signal DL is at a high level.

At time T6, the signal DL is set at the high level, and the signal TGC1 is set at a high level. Then, the signal TGC2 is set at a high level at time T7, and the signal TGC3 is set at a high level at time T8. The signal TGC1 determines when the output signal generation circuit 106 outputs a first pulse of the signal PLE_OUT. That is, the signal PLE_OUT at the high level is output at time T6. The signal TGC2 determines when to latch the output of the arithmetic circuit 102. That is, the signal LMO of the arithmetic circuit 102 is latched at time T7, and the signal LMOL is set at a high level. The signal TGC3 determines when the output signal generation circuit 106 outputs a second pulse of the signal PLE_OUT. That is, the signal PLE_OUT at the high level based on the signal LMOL is output at time T8. The signal TGC3 serves as the reset signal RST. That is, the reset signal is set at the high level at time T8. The operation returns to the previous state at time T1, the signal PON is set at the low level, and accordingly the arithmetic circuit 102 and the delay circuit 103 are powered off.

According to the above operation, the arithmetic circuit 102 and the delay circuit 103 can be powered on only in a necessary and sufficient period until the arithmetic circuit 102 outputs the operation result, and thus can be powered off for a long period.

From time T9, operation similar to that in a period from time T2 to time T8 is repeated. Note that in the operation from time T9, the signals PLE_IN[0] to PLE_IN[3] having data "1", "0", "0", and "0", respectively, are input.

<Examples of Circuits of Semiconductor Device>

Configuration examples of the latch circuits 101 [0] to 101[3], the output timing generation circuit 104, the output signal generation circuit 106, the arithmetic circuit 102, and the delay circuit 103 which are included in the semiconductor device 100 will be described below. In addition, a configuration example of a programmable logic device (PLD) including the semiconductor device 100 which includes a configuration memory and thus functions as a logic circuit whose configuration can be changed by changing data of the configuration memory (configuration data) will be described. Furthermore, a configuration example of the configuration memory will be described.

<<Latch Circuit>>

Figure 3A:
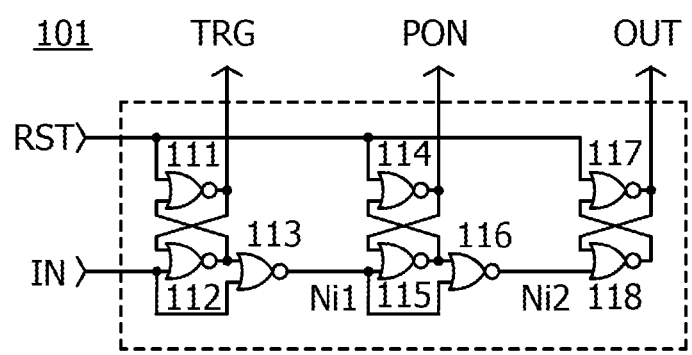
FIGS. 3A and 3B are a circuit diagram and a timing chart illustrating one embodiment of the present invention.
Figure 3B:
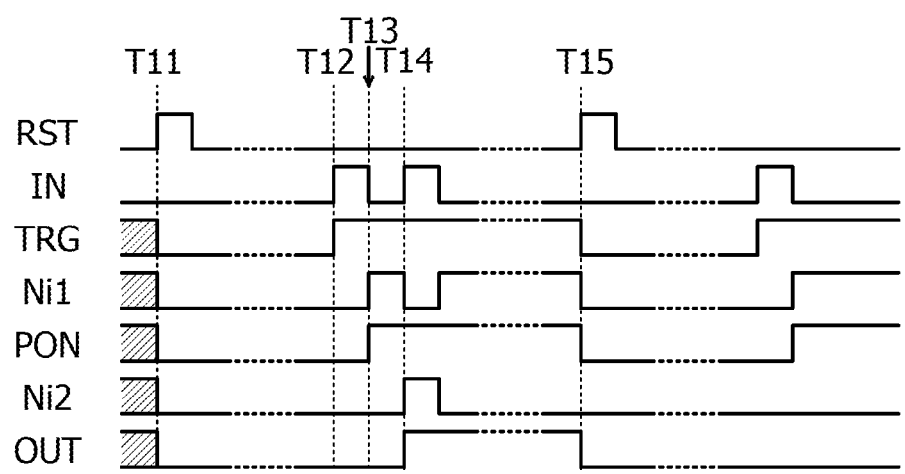

FIG. 3A illustrates an example of a circuit configuration of a latch circuit 101 which can be used as each of the latch circuits 101[0] to 101[3]. FIG. 3B is a timing chart for the latch circuit 101.

In FIG. 3A, the latch circuit 101 includes NOR gates 111 to 118. The latch circuit 101 includes an RS latch including the NOR gates 111 and 112, an RS latch including the NOR gates 114 and 115, and an RS latch including the NOR gates 117 and 118. A signal output from the NOR gate 113 is referred to as a signal Ni1, and a signal output from the NOR gate 116 is referred to as a signal Ni2.

Note that a signal N in FIG. 3A corresponds to each of the signals PLE_IN[0] to PLE_IN[3] described with reference to FIG. 1. A signal OUT in FIG. 3A corresponds to each of the signals LMI[0] to LMI[3] described with reference to FIG. 1. A signal PON in FIG. 3A corresponds to each of the signals PON[0] to PON[3] described with reference to FIG. 1. A signal RST corresponds to the signal RST described with reference to FIG. 1. A signal TRG is shown for the sake of explanation, but is not necessarily output to the outside.

A case where data of the signal N is "1", i.e., a case where the signal N has two pulses, will be described with reference to FIG. 3B. First, when the signal RST is set at a high level at time T11, the signal TRG, the signal PON, the signal OUT, the signal Ni1, and the signal Ni2 are each at a low level. When the signal N is set at a high level at time T12, the signal TRG is at a high level. Next, when the signal N is set at the low level at time T13, the signal Ni1 is at a high level and the signal PON is at a high level, and subsequently, an inverted signal of the signal N is output as the signal Ni1. Then, when the signal N is set at the high level at time T14, the signal Ni1 is at the low level, the signal Ni2 is at the high level, the signal OUT is at the high level, and subsequently, an inverted signal of the signal Ni1 is output as the signal Ni2. When the signal N remains at the low level at time T14, the signal Ni2 remains at the low level and the signal OUT remains at the low level.

After time T15, operation similar to that in a period from time T11 to time T14 is repeated. Note that in the operation from time T15, data "0", i.e., one pulse, is input as the signal N.

<<Output Timing Generation Circuit>>

Figure 4A:
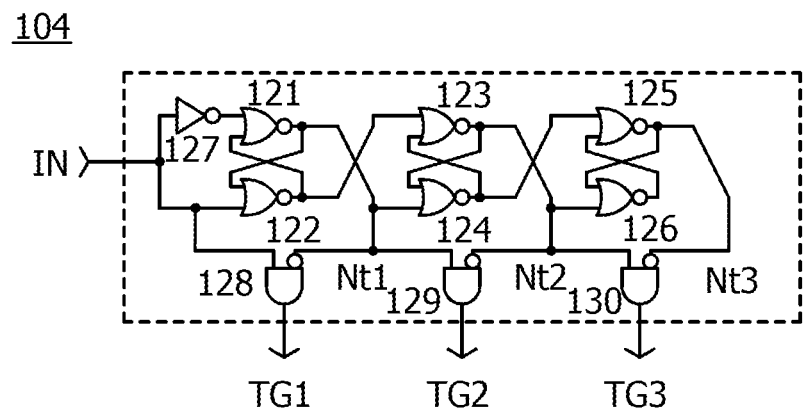
FIGS. 4A and 4B are a circuit diagram and a timing chart illustrating one embodiment of the present invention.
Figure 4B:
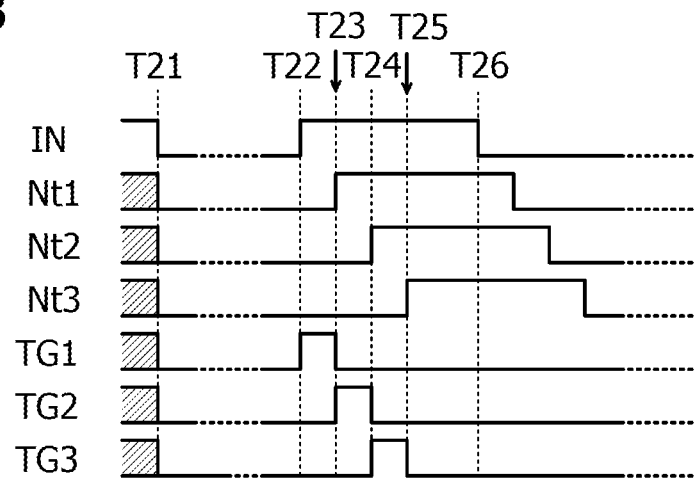

FIG. 4A illustrates an example of a circuit configuration of the output timing generation circuit 104. FIG. 4B is a timing chart for the output timing generation circuit 104.

In FIG. 4A, the output timing generation circuit 104 includes NOR gates 121 to 126, an inverter 127, and AND gates 128 to 130. The output timing generation circuit 104 includes an RS latch including the NOR gates 121 and 122, an RS latch including the NOR gates 123 and 124, and an RS latch including the NOR gates 125 and 126. A signal output from the NOR gate 121 is referred to as a signal Nt1, a signal output from the NOR gate 123 is referred to as a signal Nt2, and a signal output from the NOR gate 125 is referred to as a signal Nt3.

Note that a signal IN in FIG. 4A corresponds to the signal DL described with reference to FIG. 1. A signal TG1 in FIG. 4A corresponds to the signal TGC1 described with reference to FIG. 1. A signal TG2 in FIG. 4A corresponds to the signal TGC2 described with reference to FIG. 1. A signal TG3 corresponds to the signal TGC3 described with reference to FIG. 1.

In FIG. 4B, first, at time T21, the signal IN, the signal Nt1, the signal Nt2, the signal Nt3, the signal TG1, the signal TG2, and the signal TG3 are each at a low level. Next, when the signal IN is set at a high level at time T22, the signal Nt1 is set at a high level at time T23 with a delay in the RS latch. Subsequently, the signals Nt2 and Nt3 are sequentially set at a high level at times T24 and T25 with delays in the RS latches, respectively. When the signal IN is at the high level and the signal Nt1 is at the low level, the signal TG1 is at a high level. When the signal Nt1 is at the high level and the signal Nt2 is at the low level, the signal TG2 is at a high level. When the signal Nt2 is at the high level and the signal Nt3 is at the low level, the signal TG3 is at a high level. Thus, pulse signals having pulse widths which depend on delay times in the RS latches are output as the signals TG1, TG2, and TG3. Note that when the signal IN is subsequently at the low level at time T26, the signals Nt1, Nt2, and Nt3 are sequentially set at the low level.

Note that when RS latch circuits having similar circuit configurations are used in the latch circuit 101 in FIG. 3A and the output timing generation circuit 104 in FIG. 4A, a signal having a pulse width necessary and sufficient for the operation of the semiconductor device 100 can be used. This is because the pulse width of a pulse signal generated by the output timing generation circuit 104 corresponds to a delay time due to the operation of the RS latch in the output timing generation circuit 104; therefore, when taken into the latch circuit 101, the signal has a pulse width necessary and sufficient for the operation of the RS latch in the latch circuit 101. Note that the delay times are affected by process technology, power supply voltage, temperature, or the like, but they are corrected in a self-aligned manner because the operation speed of the RS latches in the latch circuit 101 is also similarly affected. Thus, stable circuit operation can be maintained.

<<Output Signal Generation Circuit>>

Figure 5:
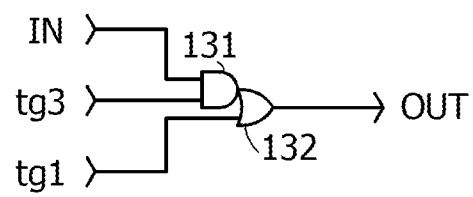
FIG. 5 is a circuit diagram illustrating one embodiment of the present invention.

FIG. 5 illustrates an example of a circuit configuration of the output signal generation circuit 106.

In FIG. 5, the output signal generation circuit 106 includes an AND gate 131 and an OR gate 132. Signals IN and tg3 are input to the AND gate 131. An output signal of the AND gate 131 and a signal tg1 are input to the OR gate 132. The OR gate 132 outputs a signal OUT.

Note that the signal IN in FIG. 5 corresponds to the signal LMOL described with reference to FIG. 1. The signal tg1 in FIG. 5 corresponds to the signal TGC1 described with reference to FIG. 1. The signal tg3 in FIG. 5 corresponds to the signal TGC3 described with reference to FIG. 1. The signal OUT in FIG. 5 corresponds to the signal PLE_OUT described with reference to FIG. 1.

The output signal generation circuit 106 in FIG. 5 outputs the signal OUT at a time determined by the signals tg1 and tg3. Note that in the case where the signal IN is at a high level (or a low level), the signal OUT is set at a high level (or a low level) at the time when the signal tg3 is set at a high level.

<<Arithmetic Circuit>>

Figure 6A:
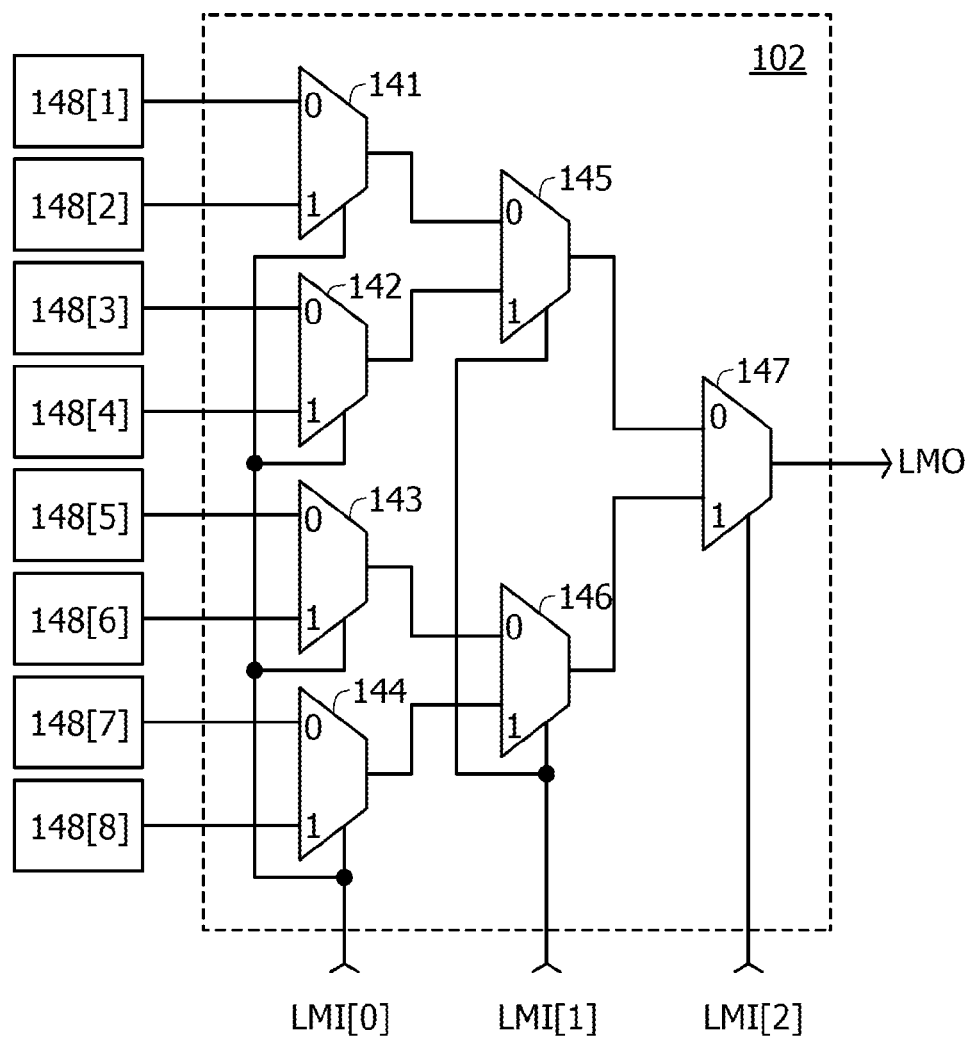
FIGS. 6A and 6B are circuit diagrams illustrating one embodiment of the present invention.
Figure 6B:
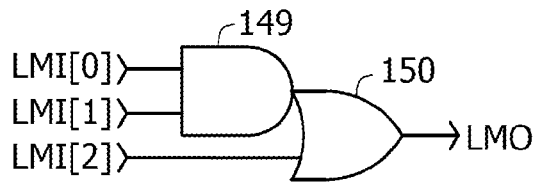

FIGS. 6A and 6B illustrate an example of a circuit configuration of the arithmetic circuit 102.

The arithmetic circuit 102 illustrated in FIG. 6A includes two-input multiplexers 141 to 147. Signals corresponding to configuration data stored in configuration memories 148[1] to 148[8] are supplied to input terminals of the multiplexers 141 to 144. FIG. 6A illustrates an example where three data signals LMI[0] to LMI[2] are supplied and a signal LMO is output.

Note that the arithmetic circuit 102 may further include any or all of a diode, a resistor, a logic element, and a switch in addition to the multiplexers. Examples of the logic element include a buffer, an inverter, a NAND gate, a NOR gate, a three-state buffer, and a clocked inverter.

In the example of the arithmetic circuit 102 illustrated in FIG. 6A, three-input one-output logic operation is performed; however, one embodiment of the present invention is not limited to this example. Logical operation with four or more inputs and two or more outputs can be performed by changing the circuit configuration of the arithmetic circuit and configuration data stored in configuration memories, as appropriate.

Signals corresponding to configuration data are input from the configuration memories 148[1] to 148[8] to the input terminals of the multiplexers 141 to 144, whereby the kind of operation performed by the arithmetic circuit 102 can be determined.

For example, signals corresponding to configuration data having logical values "0", "1", "0", "1", "0", "1", "1", and "1" are input from the configuration memories 148[1] to 148[8] to the arithmetic circuit 102 in FIG. 6A; in that case, the function of a circuit including an AND gate 149 and an OR gate 150 illustrated in FIG. 6B is achieved.

<<Delay Circuit>>

Figure 7A:
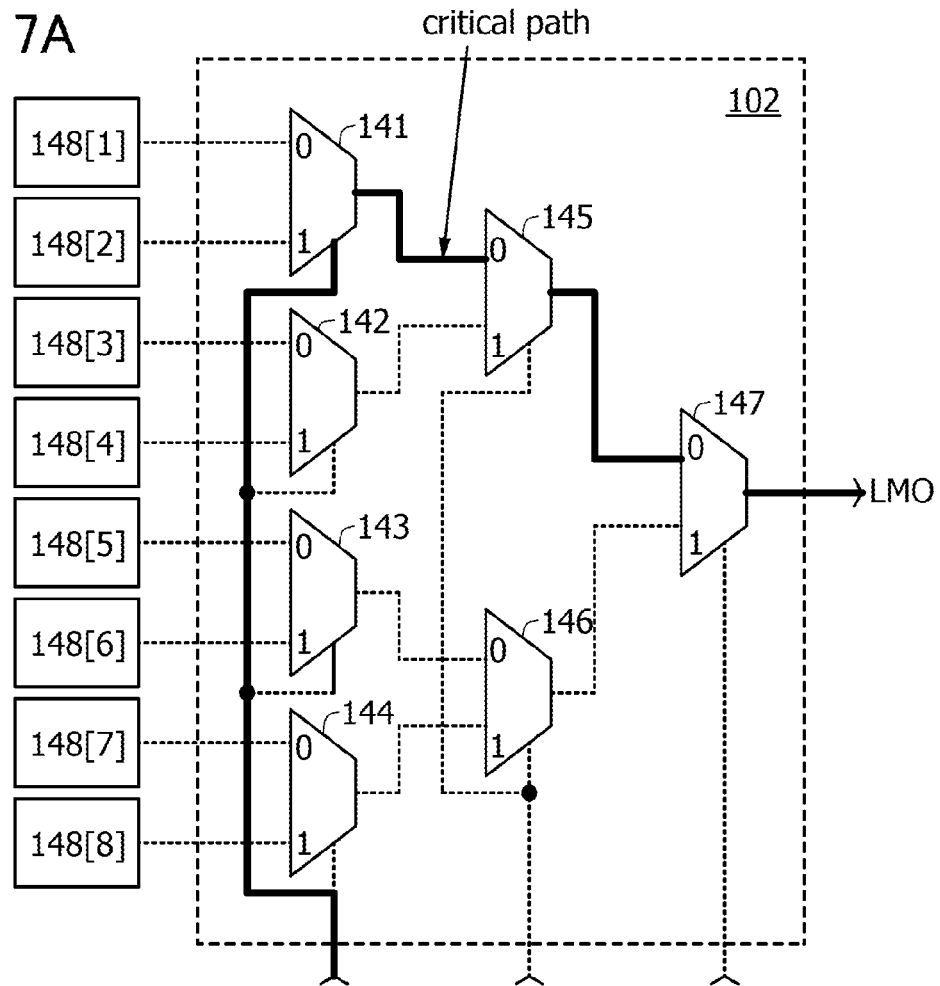
FIGS. 7A and 7B are circuit diagrams illustrating one embodiment of the present invention.
Figure 7B:
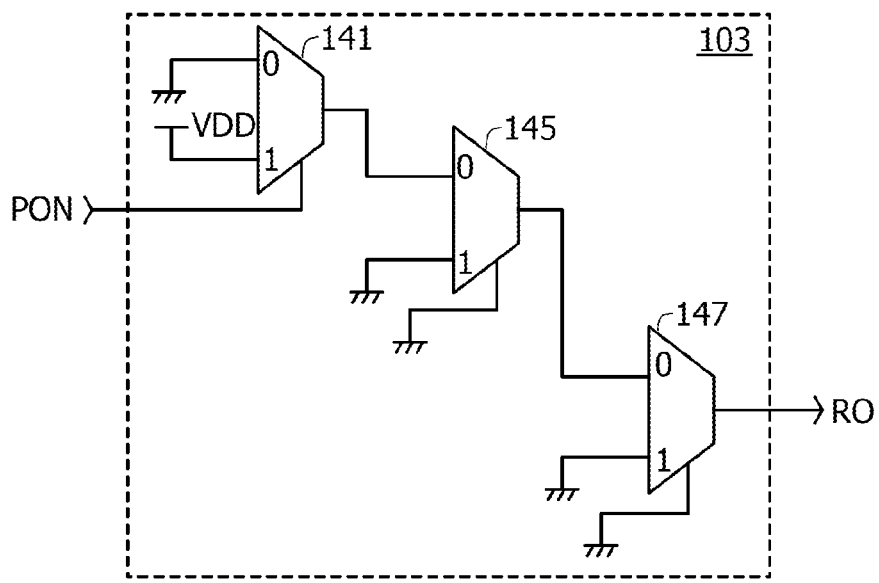

FIGS. 7A and 7B illustrate an example of a circuit configuration of the delay circuit 103. The delay circuit 103 generates a signal RO with a delay corresponding to the delay time in the critical path of the arithmetic circuit 102 as described above.

In the case where the arithmetic circuit 102 has the circuit configuration illustrated in FIG. 6A, the critical path is, for example, a path indicated by a thick line in FIG. 7A. That is, the critical path corresponds to a path through which in response to a change of the signal LMI[0] to the high level, the multiplexer 141 selects input data "1" (data of the configuration memory 148[2]) and outputs a corresponding high-level signal, and the signal LMO output via the multiplexers 145 and 147 in this order becomes a high-level signal. In that case, the delay circuit 103 can be achieved with a circuit configuration illustrated in FIG. 7B which is the same as the circuit configuration in FIG. 6A.

Note that a signal PON in FIG. 7B corresponds to the signal PON described with reference to FIG. 1. A signal RO in FIG. 7B corresponds to the signal RO described with reference to FIG. 1. Note that high- or low-level signals are supplied to the other input terminals of the multiplexers in FIG. 6A.

Note that the delay circuit 103 is preferably configured such that the signal RO is set at the high level after the signal PON is set at the high level. Therefore, in the case where the critical path of the arithmetic circuit 102 corresponds to a path through which the signal LMO is set at the high level after an input signal is set at a low level, it is preferable that an inverted signal of the signal PON input to the delay circuit 103 be input to the critical path. In the case where the critical path of the arithmetic circuit 102 corresponds to a path through which the signal LMO is set at the low level after an input signal is set at a high level, it is preferable that an inverted signal of the signal LMO be output as the signal RO from the delay circuit 103. Furthermore, in the case where the critical path of the arithmetic circuit 102 corresponds to a path through which the signal LMO is set at the low level after an input signal is set at a low level, it is preferable that an inverted signal of the signal PON input to the delay circuit 103 be input to the critical path and an inverted signal of the signal LMO be output as the signal RO from the delay circuit 103. Note that the delay circuit 103 is preferably configured such that the signal RO is at the low level when the signal PON is at the low level. Accordingly, the length of a period required for the operation by the arithmetic circuit 102 can be precisely estimated, and a power supply voltage can be supplied to the arithmetic circuit 102 for a necessary and sufficient period. Thus, the effect of power gating can be increased.

<<PLD>>

Figure 8:
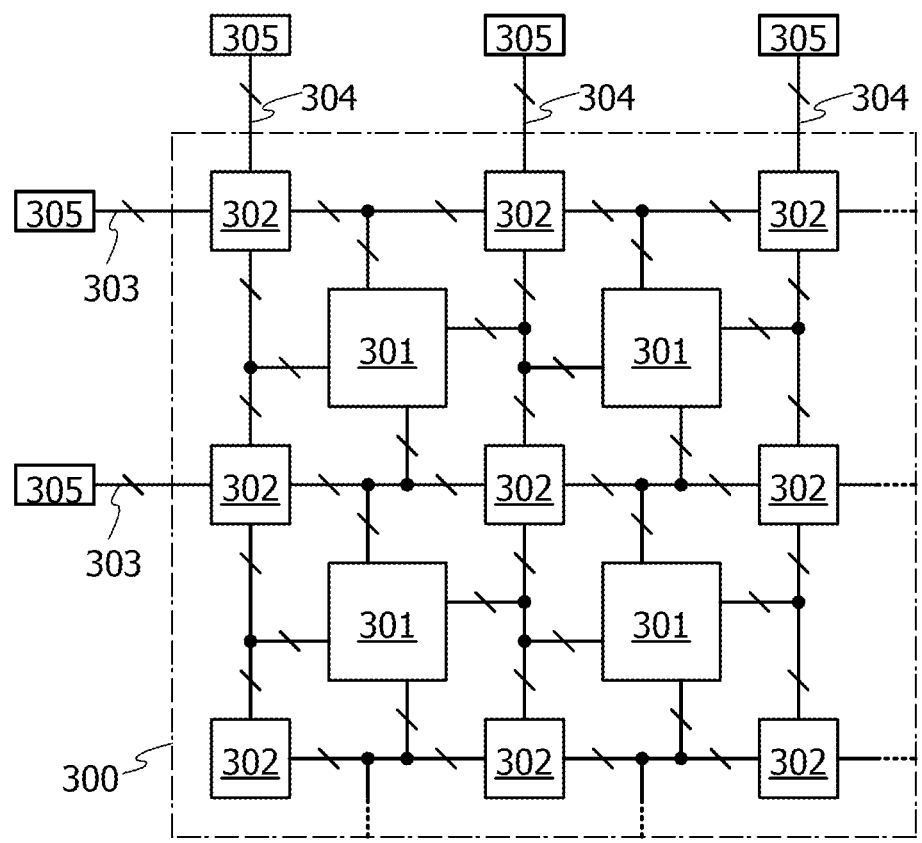
FIG. 8 is a block diagram illustrating one embodiment of the present invention.

FIG. 8 is an example of a block diagram of a PLD. A PLD 300 includes logic circuits 301, switches 302, horizontal wiring groups 303, and vertical wiring groups 304.

Each of the logic circuits 301 is the logic circuit described with reference to FIG. 1. The logic circuits 301 can change their functions in accordance with configuration data.

A plurality of wirings are formed to surround the logic circuits 301. In FIG. 8, these wirings consist of the plurality of horizontal wiring groups 303 and the plurality of vertical wiring groups 304. A wiring group is a bundle of a plurality of wirings.

The switch 302 is provided at an intersection of the horizontal wiring group 303 and the vertical wiring group 304. The switch 302 can change electrical continuity between terminals (either an on state or an off state) in accordance with configuration data. The plurality of switches 302 are provided to control connections between the horizontal wiring groups 303 and the vertical wiring groups 304.

Input and output terminals 305 are connected to the horizontal wiring groups 303 and the vertical wiring groups 304. Through the input and output terminals 305, signals are transmitted to and received from circuits provided outside the PLD 300. For example, in FIG. 8, the input and output terminals 305 are connected to the horizontal wiring groups 303 and the vertical wiring groups 304 on the left, right, top, and bottom sides. With the use of the horizontal wiring groups 303 and the vertical wiring groups 304, each of the logic circuits 301 can be connected to other logic circuits 301. A connection path between one logic circuit 301 and another logic circuit 301 is determined by the switch 302.

Whether the switch 302 is turned on or off is determined in accordance with the configuration memory which stores configuration data. In the case of a rewritable structure, the configuration memory provided in the switch 302 preferably includes a nonvolatile memory element to prevent loss of the stored configuration data due to a stop of power supply.

<Configuration Memory>

FIGS. 9A and 9B and FIGS. 10A and 10B illustrate examples of circuit configurations which can be applied to the configuration memory.

It is preferable to use a nonvolatile memory element as a memory element included in the configuration memory. Examples of the nonvolatile memory element include a flash memory, a ferroelectric random access memory (FeRAM), a magnetoresistive random access memory (MRAM), a phase change random access memory (PRAM), a resistive random access memory (ReRAM), and the like. Alternatively, a circuit which holds data by holding charge and which utilizes an extremely low off-state current of an OS transistor may be used as the memory element. By forming a memory element using an OS transistor, the transistor and a transistor including a silicon layer can be stacked.

Note that a volatile memory element may be used as the memory element included in the configuration memory. For example, a logic element may be configured by utilizing an inverter loop of an SRAM.

Figure 9A:
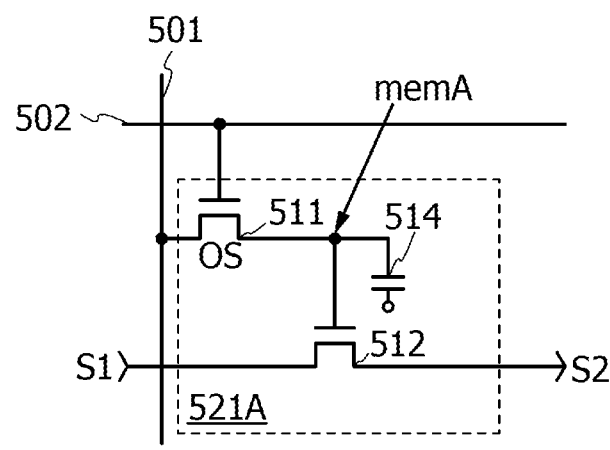
FIGS. 9A and 9B are circuit diagrams illustrating one embodiment of the present invention.
Figure 9B:
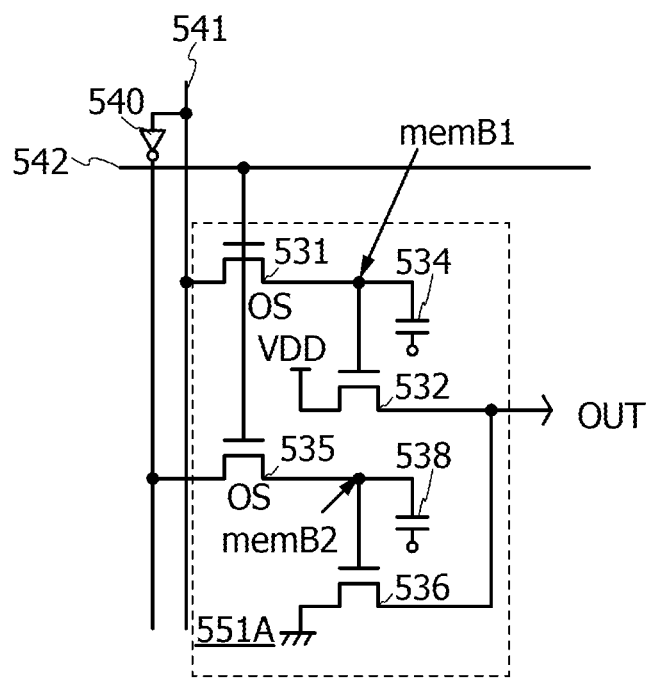
Figure 10A:
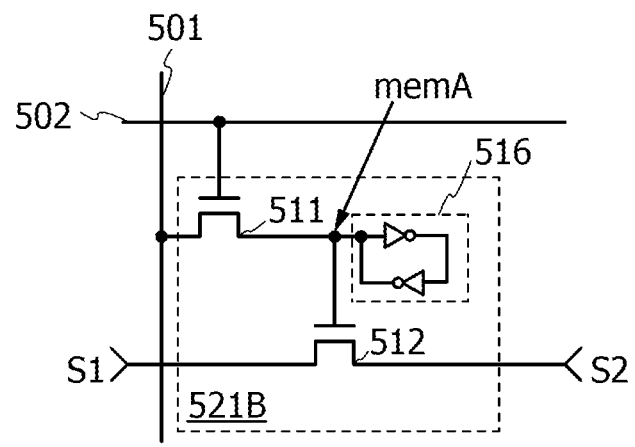
FIGS. 10A and 10B are circuit diagrams illustrating one embodiment of the present invention.
Figure 10B:
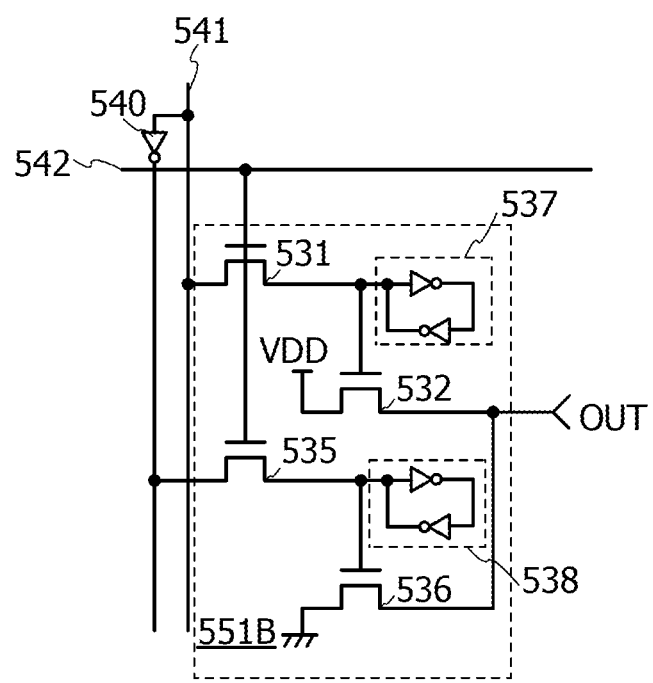

FIGS. 9A and 9B each illustrate an example of the configuration memory in which charge is held by utilizing a low off-state current of an OS transistor and a potential corresponding to the charge is stored as configuration data. FIGS. 10A and 10B each illustrate an example of the configuration memory in which a potential is held by utilizing an inverter loop of an SRAM and is stored as configuration data.

A configuration memory 521A provided in the switch 302, which is illustrated in FIG. 9A, includes an OS transistor in the configuration memory. When the configuration memory has a structure in which charge is held by utilizing the low off-state current of the OS transistor and a potential corresponding to the charge is stored as configuration data, the OS transistor can be stacked over a transistor including a channel formation region in a silicon semiconductor film (hereinafter referred to as a Si transistor) in sequential steps to fabricate the configuration memory, which offers a significant cost advantage.

In the configuration memory 521A in FIG. 9A, charge is held in a node memA and a potential corresponding to the charge is stored as configuration data. The electrical continuity between a terminal S1 and a terminal S2 is controlled in accordance with the stored configuration data.

The configuration memory 521A in FIG. 9A includes a transistor 511, a transistor 512, and a capacitor 514. In the drawing, "OS" is written in order to indicate that the transistor 511 is an OS transistor.

In the configuration memory 521A in FIG. 9A, a gate of the transistor 511 is connected to a word line 502. One of a source and a drain of the transistor 511 is connected to a data line 501. The other of the source and the drain of the transistor 511 is connected to a gate of the transistor 512 and the capacitor 514. One of a source and a drain of the transistor 512 is connected to the terminal S1. The other of the source and the drain of the transistor 512 is connected to the terminal S2.

In the configuration memory 521A in FIG. 9A, a potential corresponding to H level or L level is held in the node memA as configuration data. Configuration data can be stored in the node memA by using a transistor with a low off-state current as the transistor 511. In the configuration memory 521A, whether the transistor 512 is turned on or off is controlled by the potential of the configuration data. At the time of turning on the transistor 513, electrical continuity between the terminal S1 and the terminal S2 can be controlled.

FIG. 10A illustrates a configuration where a potential corresponding to H level or L level is held using an inverter loop 516, which differs from the configuration in FIG. 9A where configuration data is held by holding charge. A configuration memory 521B having the configuration in FIG. 10A and not including an OS transistor can have a function similar to that of the configuration memory in FIG. 9A.

A configuration memory 551A provided in the logic circuit 301, which is illustrated in FIG. 9B, includes an OS transistor in the configuration memory. Therefore, the OS transistor can be stacked over a Si transistor in sequential steps to fabricate the configuration memory, which offers a significant cost advantage.

In the configuration memory 551A in FIG. 9B, charge is held in a node memB1 and a node memB2 and a potential corresponding to the charge is stored as configuration data. An H-level or L-level potential is output from a terminal OUT in accordance with the stored configuration data.

The configuration memory 551A in FIG. 9B includes a transistor 531, a transistor 535, a transistor 532, a transistor 536, a capacitor 534, and a capacitor 538. In the drawing, "OS" is written in order to indicate that the transistors 531 and 535 are OS transistors.

In the configuration memory 551A in FIG. 9B, a gate of the transistor 531 is connected to a word line 542. One of a source and a drain of the transistor 531 is connected to a data line 541. The other of the source and the drain of the transistor 531 is connected to a gate of the transistor 532 and the capacitor 534. One of a source and a drain of the transistor 532 is connected to a wiring with an H-level potential (here, a potential VDD). The other of the source and the drain of the transistor 532 is connected to an output terminal OUT.

In the configuration memory 551A in FIG. 9B, a gate of the transistor 535 is connected to the word line 542. One of a source and a drain of the transistor 535 is connected to the data line 541 through an inverter 540. The other of the source and the drain of the transistor 535 is connected to a gate of the transistor 536 and the capacitor 538. One of a source and a drain of the transistor 536 is connected to a wiring with an L-level potential (here, a ground potential GND). The other of the source and the drain of the transistor 536 is connected to the output terminal OUT.

In the configuration memory 551A in FIG. 9B, potentials corresponding to H level and L level are held in the node memB1 and the node memB2 as configuration data. Configuration data can be stored in the node memB1 and the node memB2 by using a transistor with a low off-state current as the transistors 531 and 535. In the configuration memory 551A, in accordance with the potential of the configuration data, the transistors 532 and 536 are controlled so that only one of them is turned on. An H-level or L-level potential can be supplied to the output terminal OUT at the time of turning on one of the transistors 532 and 536.

Figure 24A:
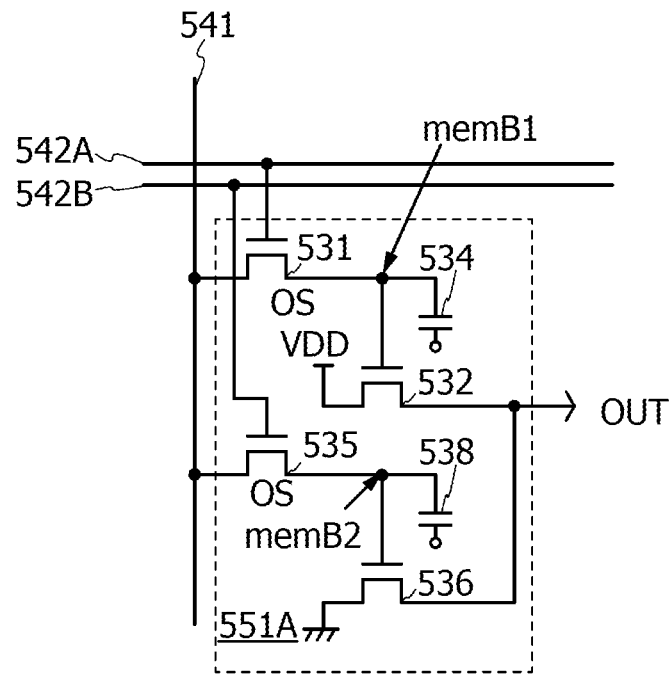
FIGS. 24A and 24B are circuit diagrams illustrating one embodiment of the present invention.
Figure 24B:
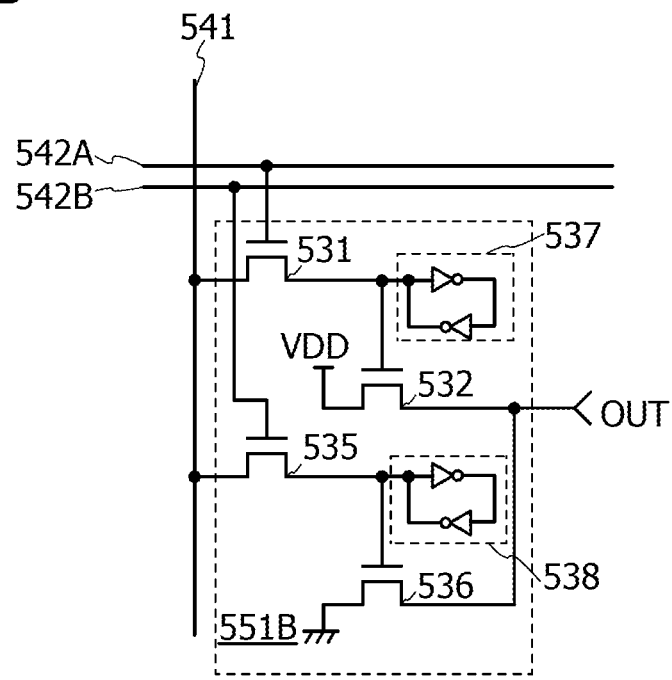

FIG. 10B illustrates a configuration where a potential corresponding to H level or L level is held using inverter loops 537 and 538, which differs from the configuration in FIG. 9B where configuration data is held by holding charge. A configuration memory 551B having the configuration in FIG. 10B and not including an OS transistor can have a function similar to that of the configuration memory in FIG. 9B. Note that the circuit configuration in FIG. 9B or 10B can be modified into a configuration in which the data line 541 is not branched and two word lines 542A and 542B are used as shown in FIG. 24A or 24B.

In the above-described manner, it is possible to provide a semiconductor device with low power consumption in which an asynchronous circuit can be achieved with a smaller number of wirings between PLEs.

Embodiment 2

In this embodiment, an example of a configuration different from that described in Embodiment 1 will be described.

Figure 11:
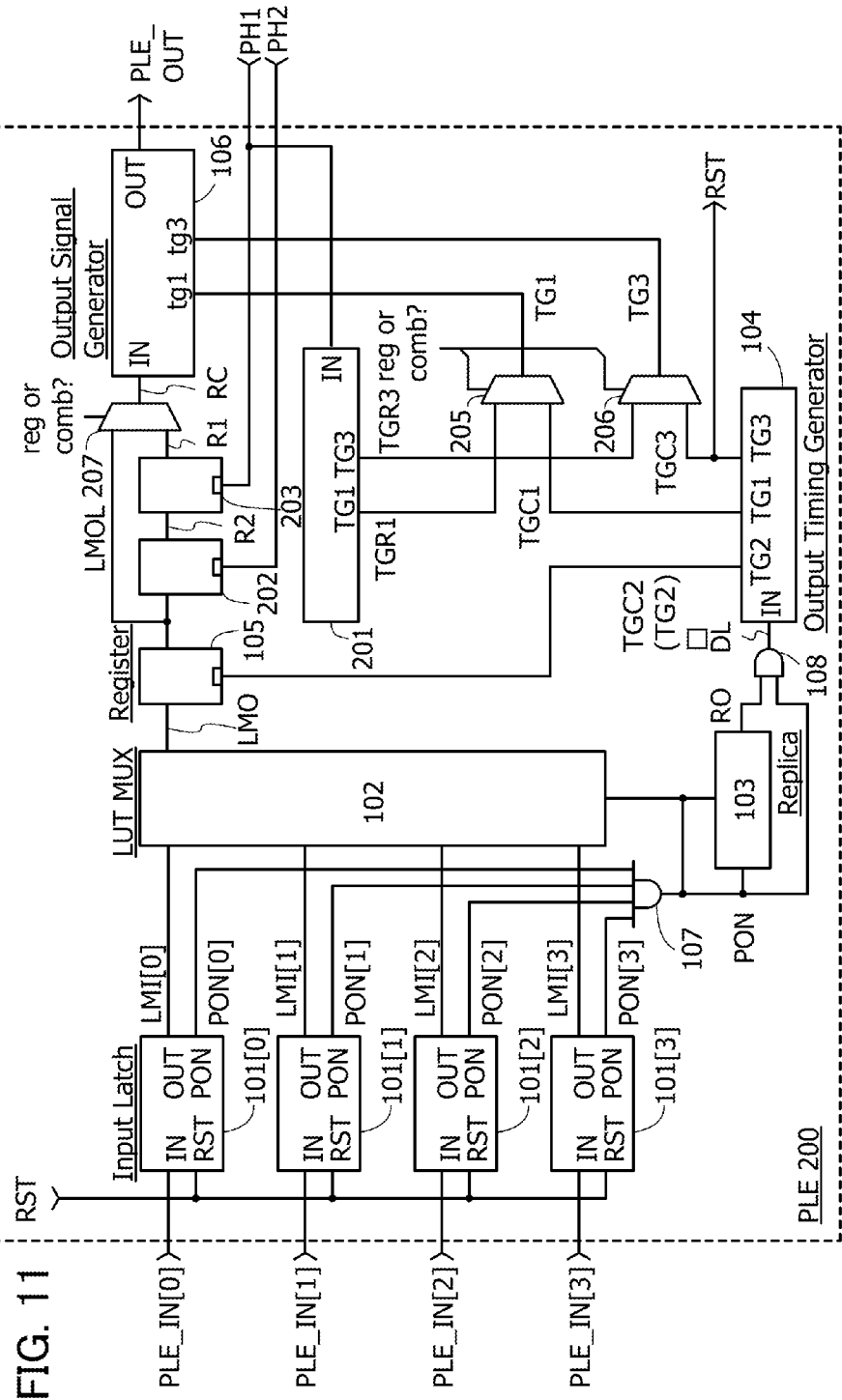
FIG. 11 is a block diagram illustrating one embodiment of the present invention.

FIG. 11 is a block diagram illustrating the configuration of the semiconductor device in one embodiment of the present invention.

A semiconductor device 200 in FIG. 11 includes the latch circuits 101[0] to 101[3], the arithmetic circuit 102, the delay circuit 103, the output timing generation circuit 104, the register 105, the output signal generation circuit 106, the AND gate 107, and the AND gate 108 which are described with reference to FIG. 1. In addition, the semiconductor device 200 in FIG. 11 includes an output timing generation circuit 201, registers 202 and 203, and multiplexers 205 to 207.

In the semiconductor device 200 in FIG. 11, power gating of the arithmetic circuit 102 and the delay circuit 103 can be implemented without the need to wait for the period of a global clock signal. Therefore, power gating can be implemented sequentially from a circuit which has completed arithmetic processing; thus, power consumption can be effectively reduced by power gating. The semiconductor device 200 in FIG. 11 can also be configured to output a signal that is synchronous with a clock signal PH1.

The semiconductor device 200 having the configuration in FIG. 11 is effective in the case where a synchronous signal is used as an input or output signal of the semiconductor device. This is particularly effective in the case where an external semiconductor device used in combination with a PLD including a reconfigurable semiconductor device is a synchronous circuit.

Components and operation of the semiconductor device 200 and circuit examples of the components will be described below.

<Components of Semiconductor Device>

FIG. 11 illustrates a circuit configuration of the semiconductor device 200 of this embodiment. Portions similar to those described in Embodiment 1 are not described in this embodiment, for which the description in the above embodiment can be referred to.

The latch circuits 101[0] to 101[3] are similar to those described in Embodiment 1. That is, when receiving the signals PLE_IN[0] to PLE_IN[3], the latch circuits 101[0] to 101[3] generate the signals PON[0] to PON[3] and the data signals LMI[0] to LMI[3] and are reset by the reset signal RST.

The arithmetic circuit 102 is similar to that described in Embodiment 1. That is, the arithmetic circuit 102 conducts arithmetic processing based on the data signals LMI[0] to LMI[3] and outputs the signal LMO.

The AND gate 107 is similar to that described in Embodiment 1. That is, the AND gate 107 generates the signal PON by conducting an AND operation on the signals PON[0] to PON[3].

The delay circuit 103 is similar to that described in Embodiment 1. That is, the delay circuit 103 receives the signal PON and generates the signal RO.

The AND gate 108 is similar to that described in Embodiment 1. That is, the AND gate 108 generates the signal DL by conducting an AND operation on the signal PON and the signal RO.

The output timing generation circuit 104 is similar to that described in Embodiment 1. That is, the output timing generation circuit 104 receives the signal DL and generates the signals TGC1 to TGC3.

The register 105 is similar to that described in Embodiment 1. That is, the register 105 latches the signal LMO and outputs the latched signal as the signal LMOL under control of the signal TGC2. Note that the signal TGC2 may be referred to as a signal TG2.

The register 202 has a function of latching the signal LMOL and outputting the latched signal as a signal R2 under control of a clock signal PH2. Owing to the register 202, the signal LMOL stored therein can be output as the signal R2 at a predetermined time.

The register 203 has a function of latching the signal R2 and outputting the latched signal as a signal R1 under control of the clock signal PH1. Owing to the register 203, the signal R2 stored therein can be output as the signal R1 at a predetermined time.

The multiplexer 207 has a function of selecting the signal LMOL when a data signal is output asynchronously and selecting the signal R1 when a data signal is output in synchronization with a clock signal, and outputting the selected signal as a signal RC. Owing to the multiplexer 207, an asynchronous signal or a signal synchronous with the clock signal PH1 can be selected and output as the signal PLE_OUT. Note that the term "reg or comb?" in FIG. 11 corresponds to configuration data for selecting a synchronous signal or an asynchronous signal to be output as the signal PLE_OUT. In the case of the synchronous signal, the signal R1 is selected, and in the case of the asynchronous signal, the signal LMOL is selected.

The output timing generation circuit 201 has a function of receiving the clock signal PH1 and generating signals TGR1 and TGR3. The output timing generation circuit 201 has the same circuit configuration as the output timing generation circuit 104. That is, the output timing generation circuit 201 includes RS latches and can output the signals TGR1 and TGR3 which are delayed for certain periods of time from the input of the clock signal PH1. The output timing generation circuit 201 can output the signal TGR1 which is generated with a delay for a certain period of time from the input of the clock signal PH1, and the signal TGR3 which is generated with a further delay for the certain period of time.

The multiplexer 205 has a function of selecting the signal TGC1 when a data signal is output asynchronously and selecting the signal TGR1 when a data signal is output in synchronization with a clock signal, and outputting the selected signal as the signal TG1. Owing to the multiplexer 205, an asynchronous signal or a signal synchronous with the clock signal PH1 can be selected and output as the signal PLE_OUT. In the case of the synchronous signal, the signal TGR1 is selected, and in the case of the asynchronous signal, the signal TGC1 is selected.

The multiplexer 206 has a function of selecting the signal TGC3 when a data signal is output asynchronously and selecting the signal TGR3 when a data signal is output in synchronization with a clock signal, and outputting the selected signal as the signal TG1. Owing to the multiplexer 206, an asynchronous signal or a signal synchronous with the clock signal PH1 can be selected and output as the signal PLE_OUT. In the case of the synchronous signal, the signal TGR3 is selected, and in the case of the asynchronous signal, the signal TGC3 is selected.

The output signal generation circuit 106 has a function of receiving the signal RC and outputting the signal PLE_OUT based on the logical value of the signal RC at the time when the signal TG1 and the signal TG3 are set at a high level. The output signal generation circuit 106 can change the logical value of the signal PLE_OUT by outputting a pulse at the time when the signal TG1 is set at the high level and then outputting a pulse based on the logical value of the signal RC at the time when the signal TG3 is set at the high level.

<Operation of Semiconductor Device>

Figure 12:
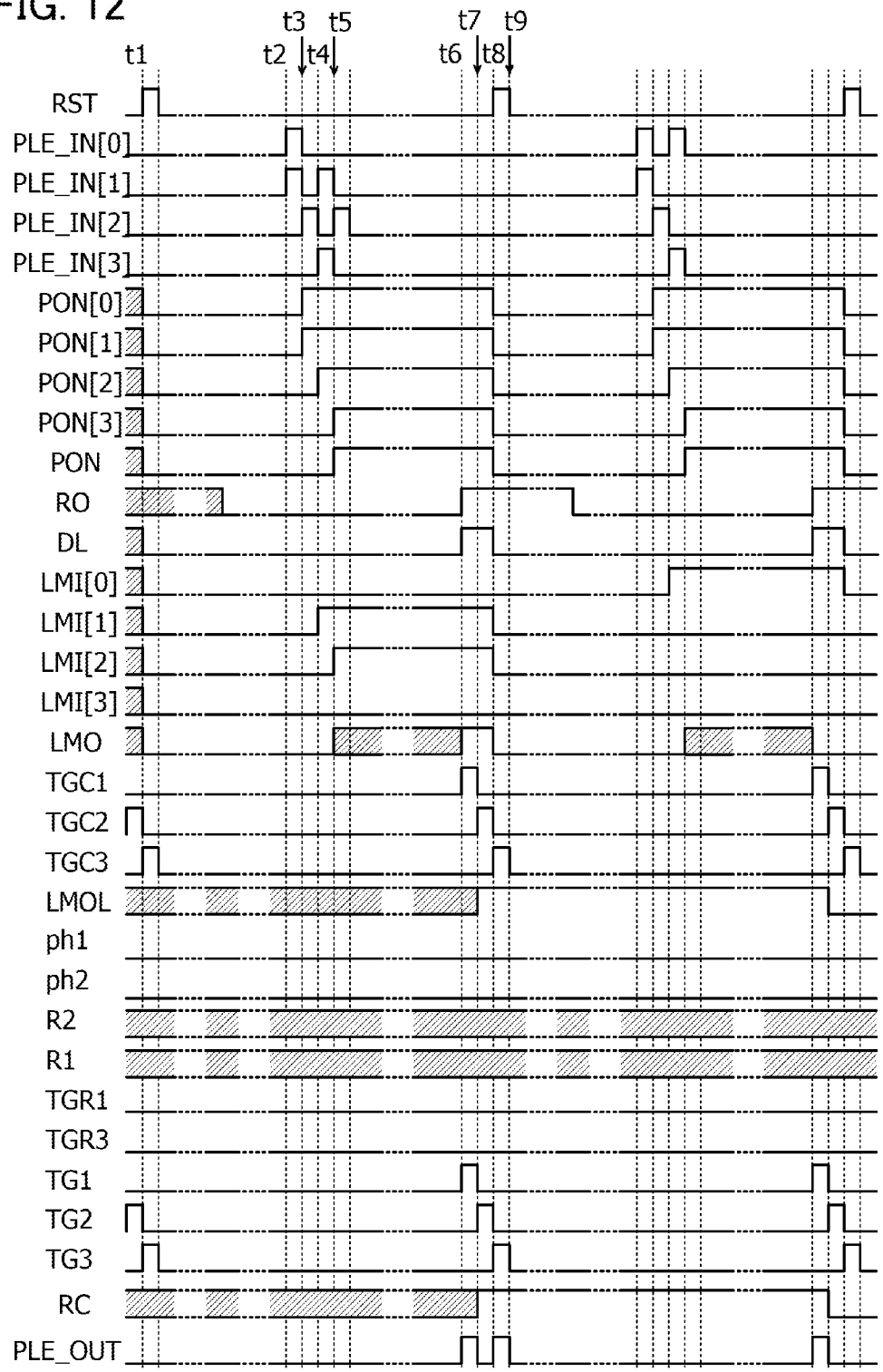
FIG. 12 is a timing chart illustrating one embodiment of the present invention.
Figure 13:
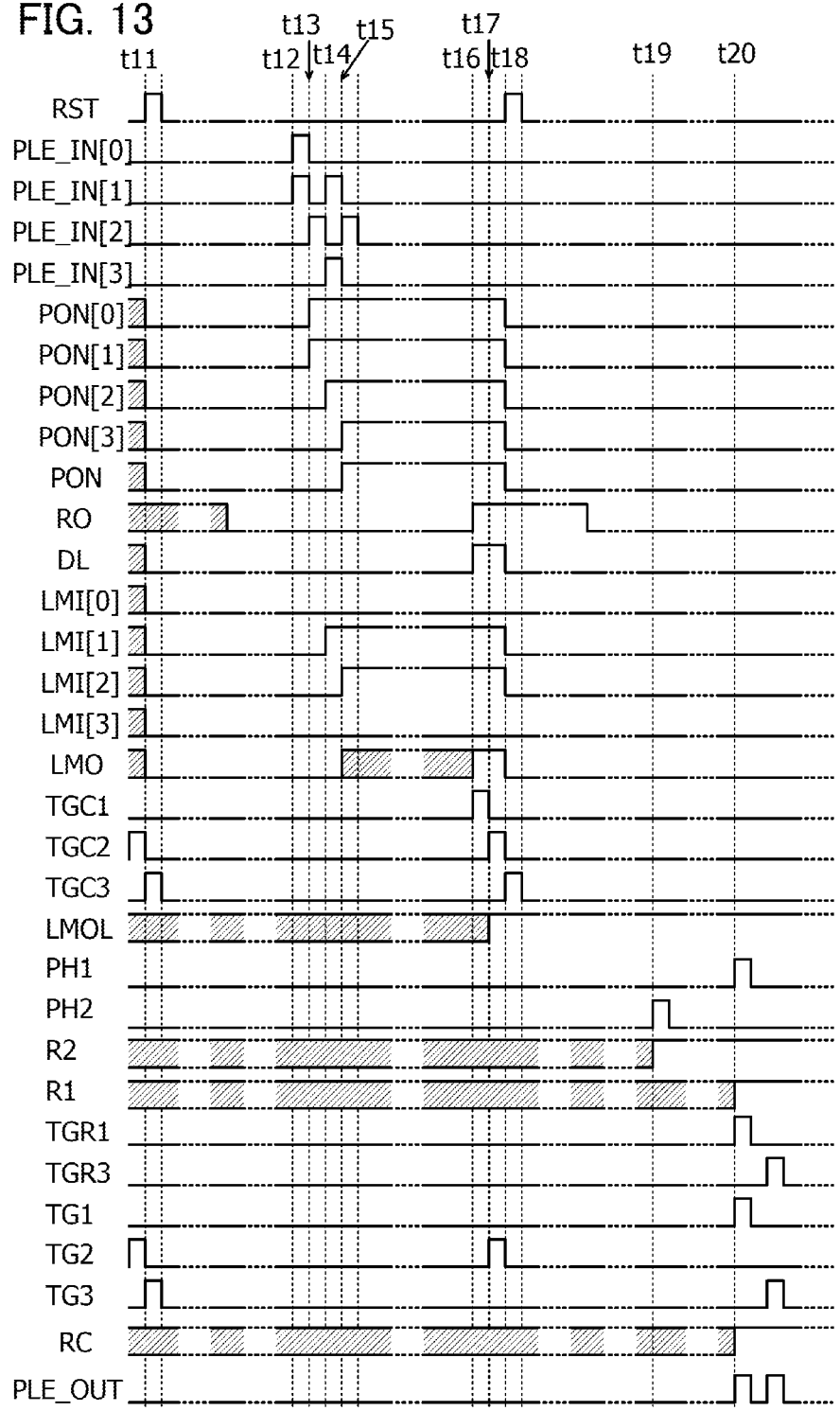
FIG. 13 is a timing chart illustrating one embodiment of the present invention.

FIGS. 12 and 13 are timing charts illustrating each signal in the semiconductor device 200 illustrated in FIG. 11. Note that FIG. 12 is a timing chart illustrating a case where the signal PLE_OUT is output asynchronously, and FIG. 13 is a timing chart illustrating a case where the signal PLE_OUT is output in synchronization with the clock signal PH1. Note that the signals in FIGS. 12 and 13 are used for the semiconductor device 200 illustrated in FIG. 11.

An operation in a period from time t1 to time t9 in the timing chart illustrated in FIG. 12 is similar to the operation in the period from time T1 to time T9 described with reference to FIG. 2. In this period, since the signal PLE_OUT is asynchronously output, the clock signals PH1 and PH2 each remain at a low level. Thus, the output timing generation circuit 201 does not operate, and the signals TGR1 and TGR3 each remain at a low level. The multiplexer 207 selects the signal LMOL as the signal RC. The multiplexer 205 selects the signal TGC1 as the signal TG1. The multiplexer 206 selects the signal TGC3 as the signal TG3. The signal PLE_OUT is output when a pulse of the signal TG1 or TG3 is input.

An operation in a period from time t11 to time t19 in the timing chart illustrated in FIG. 13 is similar to the operation in the period from time t1 to time t9 described with reference to FIG. 11. A difference is that pulses are output as the clock signal PH2 and the clock signal PH1 at time t19 and time t20, respectively. The registers 202 and 203 output the latched signals R2 and R1 when pulses are output as the clock signals PH2 and PH1. The output timing generation circuit 201 outputs the signal TGR1 and the signal TGR3 which are each generated with a certain period of delay from a rising edge of the clock signal PH1. The multiplexer 207 selects the signal R1 as the signal RC. The multiplexer 205 selects the signal TGR1 as the signal TG1. The multiplexer 206 selects the signal TGR3 as the signal TG3. The signal PLE_OUT is output when a pulse of the signal TG1 or TG3 is input.

According to the above operation, the arithmetic circuit 102 and the delay circuit 103 can be powered on only in a necessary and sufficient period until the arithmetic circuit 102 outputs the operation result, and thus can be powered off for a long period. In addition, the signal PLE_OUT can be output in synchronization with the clock signals.

<Examples of Circuits of Semiconductor Device>

Configuration examples of the latch circuits 101 [0] to 101[3], the output timing generation circuit 104, the output signal generation circuit 106, the arithmetic circuit 102, and the delay circuit 103 which are included in the semiconductor device 200 are similar to the configurations of the circuits which are included in the semiconductor device 100 described in Embodiment 1.

Embodiment 3

A configuration of a semiconductor device of one embodiment of the present invention will be described with reference to FIG. 14. Note that in this embodiment, description which overlaps with the description in the above embodiments is omitted and the above description is referred to.

Figure 14:
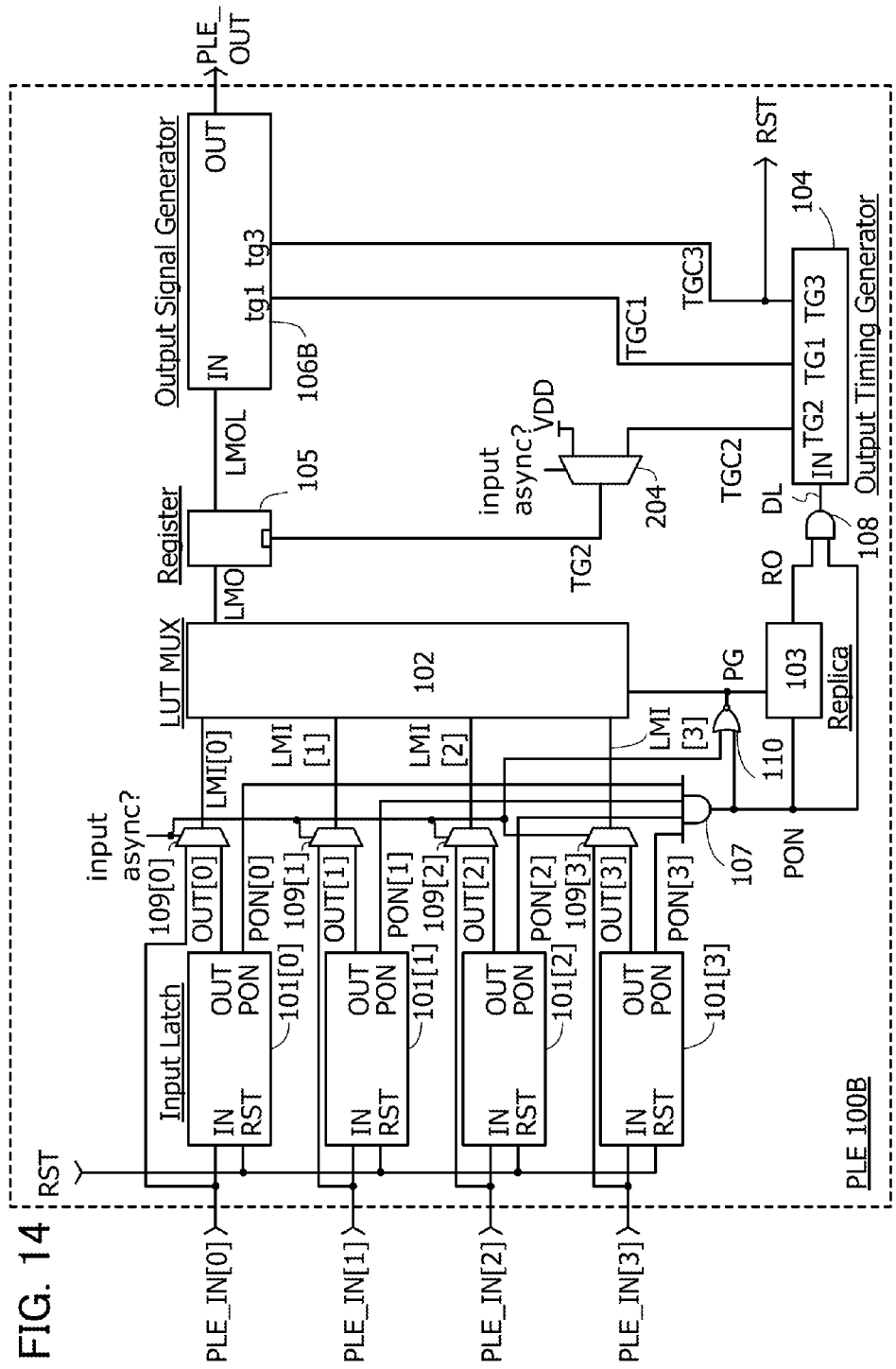
FIG. 14 is a block diagram illustrating one embodiment of the present invention.

FIG. 14 is a block diagram illustrating the configuration of the semiconductor device in one embodiment of the present invention.

A semiconductor device 100B illustrated in FIG. 14 has a function of a logic circuit capable of storing configuration data. The semiconductor device 100B functions as a reconfigurable logic circuit. In some cases, the semiconductor device 100B is referred to as a programmable logic element (PLE).

The semiconductor device 100B includes latch circuits 101 [0] to 101 [3], an arithmetic circuit 102, a delay circuit 103, an output timing generation circuit 104, a register 105, an output signal generation circuit 106B, an AND gate 107, an AND gate 108, multiplexers 109[0] to 109[3], an AND gate 110, and a multiplexer 204.

The semiconductor device 100B illustrated in FIG. 14 is capable of receiving and outputting input data without using a global clock signal. Therefore, power is not consumed for distribution of a global clock signal, leading to low power consumption.

In the semiconductor device 100B in FIG. 14, power gating of the arithmetic circuit 102 and the delay circuit 103 can be implemented without the need to wait for the period of a global clock signal. Therefore, power gating can be implemented sequentially from a circuit which has completed arithmetic processing; thus, power consumption can be effectively reduced by power gating.

The semiconductor device 100B in FIG. 14 can be used as an asynchronous circuit where a global clock signal is not used and a signal is sequentially transmitted from one circuit to another. Accordingly, the semiconductor device 100B in FIG. 14 can exchange signals with other logic circuits without using a handshaking method. Therefore, there is no need to provide wirings for a handshaking method between circuits, which enables the number of wirings to be reduced.

The circuit configuration of the semiconductor device 100B in FIG. 14 can be freely changed even when a pulse signal or a binary signal is used as an input signal. Therefore, the semiconductor device 100B can serve as a conveniently reconfigurable logic circuit.

Components and operation of the semiconductor device 100B and circuit examples of the components will be described below.

<Components of Semiconductor Device>

The latch circuits 101[0] to 101[3] in this embodiment have a function of generating signals PON[0] to PON[3] for powering on the arithmetic circuit 102 and the delay circuit 103 when receiving signals PLE_IN[0] to PLE_IN[3] which are pulse signals output from other semiconductor devices. The latch circuits 101[0] to 101[3] also have a function of determining logical values ("0" or "1") of signals output from the other semiconductor devices by using the input pulse signals, and outputting the signals OUT[0] to OUT[3] to the multiplexers 109[0] to 109[3] accordingly. The latch circuits 101 [0] to 101[3] also have a function of being initialized by the input of a reset signal RST. The latch circuits 101[0] to 101[3] include RS latches and can output the signals PON[0] to PON[3] which are delayed for certain periods of time from the inputs of the signals PLE_N[0] to PLE_IN[3]. Further, the latch circuits 101[0] to 101[3] can output the signals OUT[0] to OUT[3] which are delayed for further certain periods of time from the signals PON[0] to PON[3].

When the signals PLE_IN[0] to PLE_IN[3] in this embodiment are binary data signals, they contain data on logical values ("0" or "1") of the signals. Thus, the signals PLE_IN[0] to PLE_IN[3] are input to the multiplexers 109[0] to 109[3] not through the latch circuits 101[0] to 101[3].

Although FIG. 14 illustrates four latch circuits, i.e., the latch circuits 101[0] to 101[3], the number of latch circuits is not limited thereto. For example, the number of latch circuits may correspond to the number of signals PLE_IN. Note that latch circuits may be referred to as input latches.

Note that the signals PLE_IN[0] to PLE_IN[3] may be referred to as pulse signals when having a pulsed waveform (pulses). The signals PLE_IN[0] to PLE_IN[3] may be referred to as binary signals when having two values at high and low levels. Whether the signals PLE_IN[0] to PLE_IN[3] are pulse signals or binary signals depends on the function of the semiconductor device, and therefore, the function of the semiconductor device needs to be set in advance with configuration data. When pulse signals are used, power can be reduced by power gating more effectively as described later. This is advantageous particularly when the operating frequency is low because the length of time of power gating can be relatively increased. When binary signals are used, the operating frequency can be easily increased.

The multiplexers 109[0] to 109[3] have a function of selecting and outputting the signals OUT[0] to OUT[3] when the signals PLE_IN[0] to PLE_IN[3] are pulse signals. The multiplexers 109[0] to 109[3] have a function of selecting and outputting the signals PLE_IN[0] to PLE_IN[3] when the signals PLE_IN[0] to PLE_IN[3] are binary signals. The data signals LMI[0] to LMI[3] are output from the multiplexers 109[0] to 109[3] and then input to the arithmetic circuit 102.

The multiplexers 109[0] to 109[3] are preferably provided in advance with configuration data on whether to select the signals OUT[0] to OUT[3] or the signals PLE_IN[0] to PLE_IN[3]. Note that the term "input async?" in FIG. 14 corresponds to configuration data for selecting the signals OUT[0] to OUT[3] or PLE_IN[0] to PLE_IN[3] as output signals of the multiplexers depending on whether pulse signals or binary signals are input as the signals PLE_IN[0] to PLE_IN[3].

The arithmetic circuit 102 is similar to that described in Embodiment 1. Note that the configuration described in Embodiment 1 can be used as a detailed configuration of a configuration memory.

The AND gate 107 is similar to that described in Embodiment 1.

The NOR gate 110 has a function of generating a signal PG by conducting a NOR operation on the signal PON and configuration data. The signal PG has a function of powering on the arithmetic circuit 102 and the delay circuit 103. Note that the signal PG makes the power on when at the low level and off when at the high level.

The AND gate 107 and the NOR gate 110 in this embodiment enable the signal PG to be at the low level and the power to be continuously on when configuration data "input async?" has the logical value "1" and is at the high level and the signals PLE_IN[0] to PLE_IN[3] are binary signals. When the configuration data "input async?" has the logical value "0" and is at the low level and the signals PLE_IN[0] to PLE_IN[3] are pulse signals, the signal PG is set at the low level after the signals PLE_IN[0] to PLE_IN[3] arrive at the latch circuits 101[0] to 101[3] and after the signals PON[0] to PON[3] are set to "1" and then the signal PON is set to "1". Thus, the arithmetic circuit 102 and the delay circuit 103 can be powered on. Therefore, the arithmetic circuit 102 and the delay circuit 103 can be powered off until all the signals PLE_IN[0] to PLE_IN[3] arrive at the latch circuits 101[0] to 101[3], and can be powered on shortly before the operation of the circuits. Accordingly, power gating operation can be carried out to enable more efficient power supply.

The AND gate 107 and the NOR gate 110 can generate the signal PG for powering on the arithmetic circuit 102 and the delay circuit 103 after the signals PLE_IN[0] to PLE_IN[3] arrive at the latch circuits 101[0] to 101[3]. Therefore, the arithmetic circuit 102 and the delay circuit 103 can be powered off until the arrival of all the signals PLE_IN[0] to PLE_IN[3], and can be powered on shortly before the operation of the circuits. Accordingly, power gating operation can be carried out to enable more efficient power supply.

The delay circuit 103 is similar to that described in Embodiment 1.

The AND gate 108 is similar to that described in Embodiment 1. That is, the AND gate 108 can generate the signal DL which indicates the completion of operation for the signal LMO by the arithmetic circuit 102. The signal DL is at a high level when both the signal PON and the signal RO are at a high level, i.e., when the signal RO is generated after the delay time corresponding to the delay in the critical path of the arithmetic circuit 102 passes after the generation of the signal PON by the AND gate 107. In other words, the signal DL is generated when the operation by the arithmetic circuit 102 is completed and the signal LMO is fixed. Therefore, the completion of the operation by the arithmetic circuit 102 can be immediately known from the signal DL. In addition, the signal DL can be utilized to generate a timing signal for power gating of the arithmetic circuit 102 and a plurality of timing signals for outputting the above operation result as an output signal of the semiconductor device 100B. For example, the output timing generation circuit 104, to which the signal DL is input, can generate the reset signal RST and the like and can power off the arithmetic circuit 102 and the delay circuit 103 shortly after the completion of their operations. Accordingly, power gating operation can be carried out to enable efficient power supply.

The output timing generation circuit 104 in this embodiment has a function of receiving the signal DL and generating signals TGC1 to TGC3. Note that the output timing generation circuit 104 may be referred to as an output timing generator. The output timing generation circuit 104 includes RS latches and can output the signals TGC1 to TGC3 which are delayed for certain periods of time from the input of the signal DL. The output timing generation circuit 104 can output the signal TGC1 which is generated with a delay for a certain period of time from the input of the signal DL, the signal TGC2 which is generated with a further delay for the certain period of time, and the signal TGC3 which is generated with a still further delay for the certain period of time.

The register 105 is similar to that described in Embodiment 1.

The multiplexer 204 has a function of selecting and outputting the signal TGC2 when the signals PLE_IN[0] to PLE_IN[3] are pulse signals. The multiplexer 204 has a function of selectively outputting a potential VDD, i.e., a high level, when the signals PLE_IN[0] to PLE_IN[3] are binary signals. The signal TG2 is output from the multiplexer 204. The register 105 can output the signal LMO as the signal LMOL when the signal TG2 is at the high level.

The output signal generation circuit 106B has a function of receiving the signal LMOL and outputting a signal PLE_OUT based on a logical value of the signal LMOL at the time when the signal TGC1 and the signal TGC3 are set at a high level. Note that the output signal generation circuit 106B may be referred to as an output signal generator. The output signal generation circuit 106B can change the logical value of the signal PLE_OUT by outputting a pulse at the time when the signal TGC1 is set at the high level and then outputting a pulse based on the logical value of the signal LMOL at the time when the signal TGC3 is set at the high level.

<Operation of Semiconductor Device>

Figure 15:
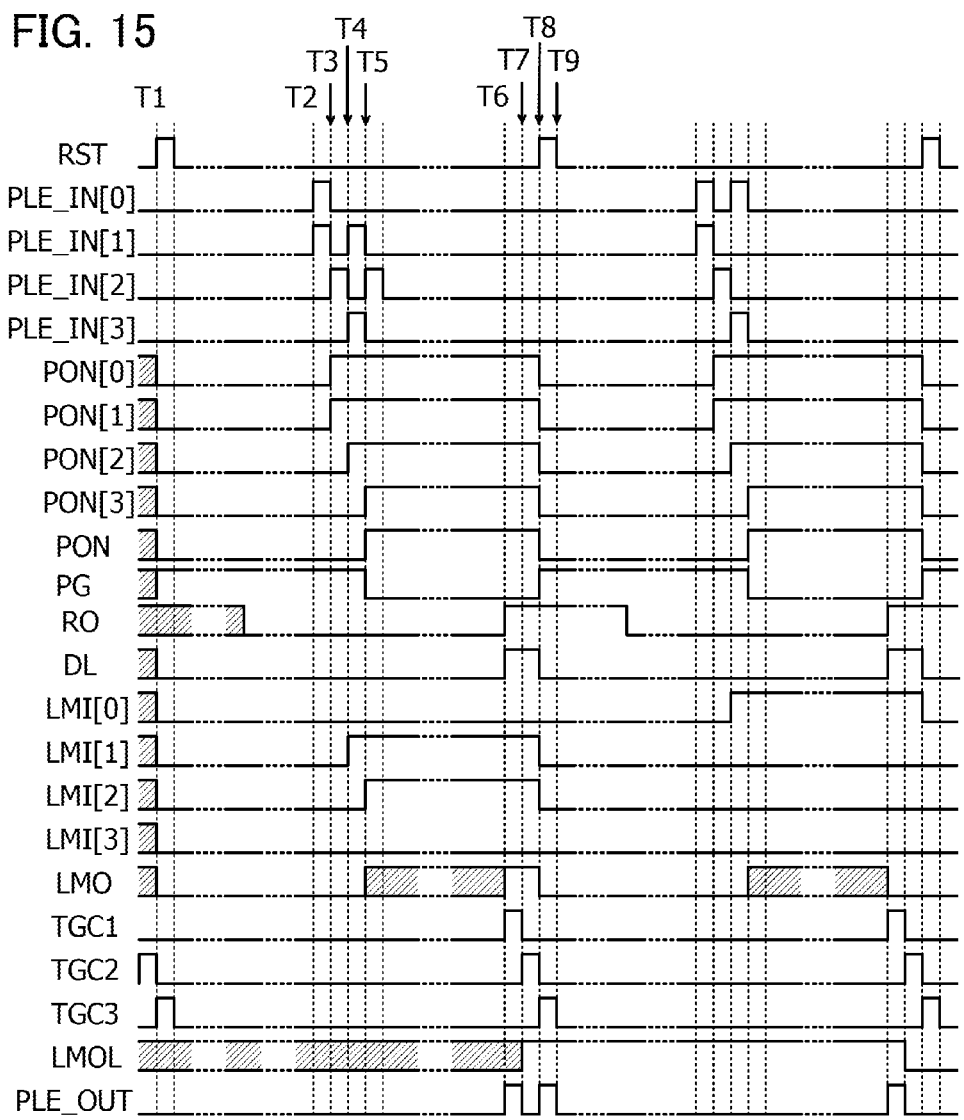
FIG. 15 is a timing chart illustrating one embodiment of the present invention.

FIG. 15 is a timing chart illustrating each signal in the semiconductor device 100B illustrated in FIG. 14. Note that data "0" of each of the signals PLE_IN[0] to PLE_IN[3] is represented by one pulse, and data "1" thereof is represented by two pulses. Note that the term "pulse" refers to a signal whose potential changes in a short period, e.g., a signal whose potential is changed from a low level to a high level and again to the low level.

Note that FIG. 15 illustrates a particular operation in which the signals PLE_IN[0] to PLE_IN[3] are pulse signals. In the above-described case where the signals PLE_IN[0] to PLE_IN[3] are binary signals, there is no operation to power off the arithmetic circuit 102 and the delay circuit 103.

Note that selection of signals to be output from the multiplexers 109 [0] to 109[3] and the multiplexer 204 is set in advance with configuration data. In the case where the signals PLE_IN[0] to PLE_IN[3] are pulse signals, the multiplexers 109[0] to 109[3] select the signals OUT[0] to OUT[3] as the data signals LMI[0] to LMI[3]. The multiplexer 204 selects the signal TGC2 as the signal TG2.

At time T1, the signal RST is set at a high level. At that time, the signals PON[0] to PON[3] output from the latch circuits 101[0] to 101[3] are at a low level, and the signal PON is also at a low level. Accordingly, the arithmetic circuit 102 and the delay circuit 103 are powered off.

At time T2, the signal PLE_IN[0] is set at a high level, and the signal PLE_IN[1] is set at a high level. This means the input of a first pulse of each of the signals PLE_IN[0] and PLE_IN[1]. Then, at time T3, the signal PLE_IN[0] is set at the low level, and the signal PLE_IN[1] is set at the low level. This means the end of the input of the first pulse of each of the signals PLE_IN[0] and PLE_IN[1]. At that time, the signal PON[0] is at a high level, and the signal PON[1] is at a high level.

At time T3, the signal PLE_IN[2] is set at a high level. This means the input of a first pulse of the signal PLE_IN[2]. Then, at time T4, the signal PLE_IN[2] is set at the low level. This means the end of the input of the first pulse of the signal PLE_IN[2]. At that time, the signal PON[2] is at a high level.

At time T4, the signal PLE_IN[3] is set at a high level. This means the input of a first pulse of the signal PLE_IN[3]. Then, at time T5, the signal PLE_IN[3] is set at the low level. This means the end of the input of the first pulse of the signal PLE_IN[3]. At that time, the signal PON[3] is at a high level. In addition, the signal PON is at a high level, and accordingly, the arithmetic circuit 102 and the delay circuit 103 are powered on.

That is, with the use of pulse signals as the signals PLE_IN[0] to PLE_IN[3], signal reception can be determined, and power supply to the arithmetic circuit 102 and the delay circuit 103 can be controlled. Accordingly, the arithmetic circuit 102 and the delay circuit 103 can be powered off until the signal reception and thus can be powered off for a long period. Furthermore, since a circuit for a handshaking method is not used, a control signal for a handshaking method is not needed, which enables the number of wirings to be reduced.

Note that the signal PLE_IN[1] is set at the high level at time T4, and the signal PLE_IN[2] is set at the high level at time T5. This means that a second pulse of each of the signals PLE_IN[1] and PLE_IN[2] is input, and that the data of the input signal has the logical value "1". On the other hand, a second pulse of each of the signals PLE_IN[0] and PLE_IN[3] is not input, which means that the data of the input signal has the logical value "0". That is, the signals PLE_IN[0] to PLE_IN[3] having data "0", "1", "1", and "0", respectively, are input.

When the signal PON is at the high level and the signal PG is at the low level at time T5 and accordingly the arithmetic circuit 102 and the delay circuit 103 are powered on, the signal RO output from the delay circuit 103 is changed from the low level to the high level with a certain period of delay at time T6. At that time, the value of the signal LMO is fixed. In FIG. 15, the fixed value of the signal LMO is the high level. In addition, since the signal RO is at the high level, the signal DL is at a high level.

At time T6, the signal DL is set at the high level, and the signal TGC1 is set at a high level. Then, the signal TGC2 is set at a high level at time T7, and the signal TGC3 is set at a high level at time T8. The signal TGC1 determines when the output signal generation circuit 106B outputs a first pulse of the signal PLE_OUT. That is, the signal PLE_OUT at the high level is output at time T6. The signal TGC2 determines when to latch the output of the arithmetic circuit 102. That is, the signal LMO of the arithmetic circuit 102 is latched at time T7, and the signal LMOL is set at a high level. The signal TGC3 determines when the output signal generation circuit 106B outputs a second pulse of the signal PLE_OUT. That is, the signal PLE_OUT at the high level based on the signal LMOL is output at time T8. The signal TGC3 serves as the reset signal RST. That is, the reset signal is set at the high level at time T8. The operation returns to the previous state at time T1, the signal PON is set at the low level, the signal PG is set at the high level, and accordingly the arithmetic circuit 102 and the delay circuit 103 are powered off.

According to the above operation, the arithmetic circuit 102 and the delay circuit 103 can be powered on only in a necessary and sufficient period until the arithmetic circuit 102 outputs the operation result, and thus can be powered off for a long period.

From time T9, operation similar to that in a period from time T2 to time T8 is repeated. Note that in the operation from time T9, the signals PLE_IN[0] to PLE_IN[3] having data "1", "0", "0", and "0", respectively, are input.

<Examples of Circuits of Semiconductor Device>

Configuration examples of the latch circuits 101 [0] to 101[3], the output timing generation circuit 104, the output signal generation circuit 106B, the arithmetic circuit 102, and the delay circuit 103 which are included in the semiconductor device 100B will be described below. In addition, a configuration example of a programmable logic device (PLD) including the semiconductor device 100B which includes a configuration memory and thus functions as a logic circuit whose configuration can be changed by changing data of the configuration memory (configuration data) will be described. Furthermore, a configuration example of the configuration memory will be described.

The latch circuits 101[0] to 101[3] are similar to those described in Embodiment 1. That is, when receiving the signals PLE_IN[0] to PLE_IN[3], the latch circuits 101[0] to 101[3] generate the signals PON[0] to PON[3] and the data signals OUT [0] to OUT[3] and are reset by the reset signal RST.

The circuit configuration and the timing chart for the output timing generation circuit are the same as those illustrated in FIGS. 4A and 4B, respectively.

<<Output Signal Generation Circuit>>

Figure 16:
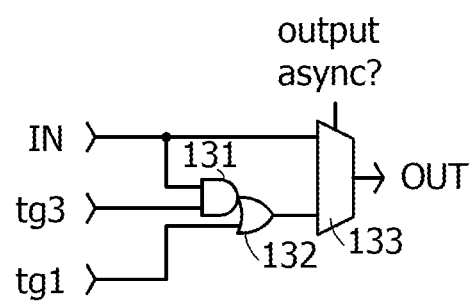
FIG. 16 is a circuit diagram illustrating one embodiment of the present invention.

FIG. 16 illustrates an example of a circuit configuration of the output signal generation circuit 106B.

In FIG. 16, the output signal generation circuit 106B includes an AND gate 131, an OR gate 132, and a multiplexer 133. Signals IN and tg3 are input to the AND gate 131. An output signal of the AND gate 131 and a signal tg1 are input to the OR gate 132. The signal IN and an output signal of the OR gate 132 are input to the multiplexer 133. The multiplexer 133 outputs a signal OUT.

The multiplexer 133 is preferably provided in advance with configuration data on whether to select the signal IN or the output signal of the OR gate 132. Note that the term "output async?" in FIG. 16 corresponds to configuration data for selecting the output signal of the multiplexer depending on whether the signal PLE_OUT is a pulse signal or a binary data signal.

Note that the signal IN in FIG. 16 corresponds to the signal LMOL described with reference to FIG. 14. The signal tg1 in FIG. 16 corresponds to the signal TGC1 described with reference to FIG. 14. The signal tg3 in FIG. 16 corresponds to the signal TGC3 described with reference to FIG. 14. The signal OUT in FIG. 16 corresponds to the signal PLE_OUT described with reference to FIG. 14.

The output signal generation circuit 106B in FIG. 16 outputs the signal IN to output a binary data signal, or outputs the signal OUT at a time determined by the signals tg1 and tg3 to output a pulse signal. Note that when the signal IN is at a high level (or a low level), the signal OUT is set at a high level (or a low level) at the time when the signal tg3 is set at a high level.

<<Arithmetic Circuit>>

The arithmetic circuit has the same circuit configuration as that illustrated in FIGS. 6A and 6B.

<<Delay Circuit>>

The delay circuit has the same circuit configuration as that illustrated in FIGS. 7A and 7B.

<<PLD>>

The PLD is as illustrated in the block diagram of FIG. 8.

<Configuration Memory>

The configuration memory has the same circuit configuration as that illustrated in FIG. 9A or 9B or FIG. 10A or 10B.

In the above-described manner, it is possible to provide a semiconductor device with low power consumption in which an asynchronous circuit can be achieved with a smaller number of wirings between PLEs.

Embodiment 4

In this embodiment, an example of a configuration different from that described in Embodiment 3 will be described.

Figure 17:
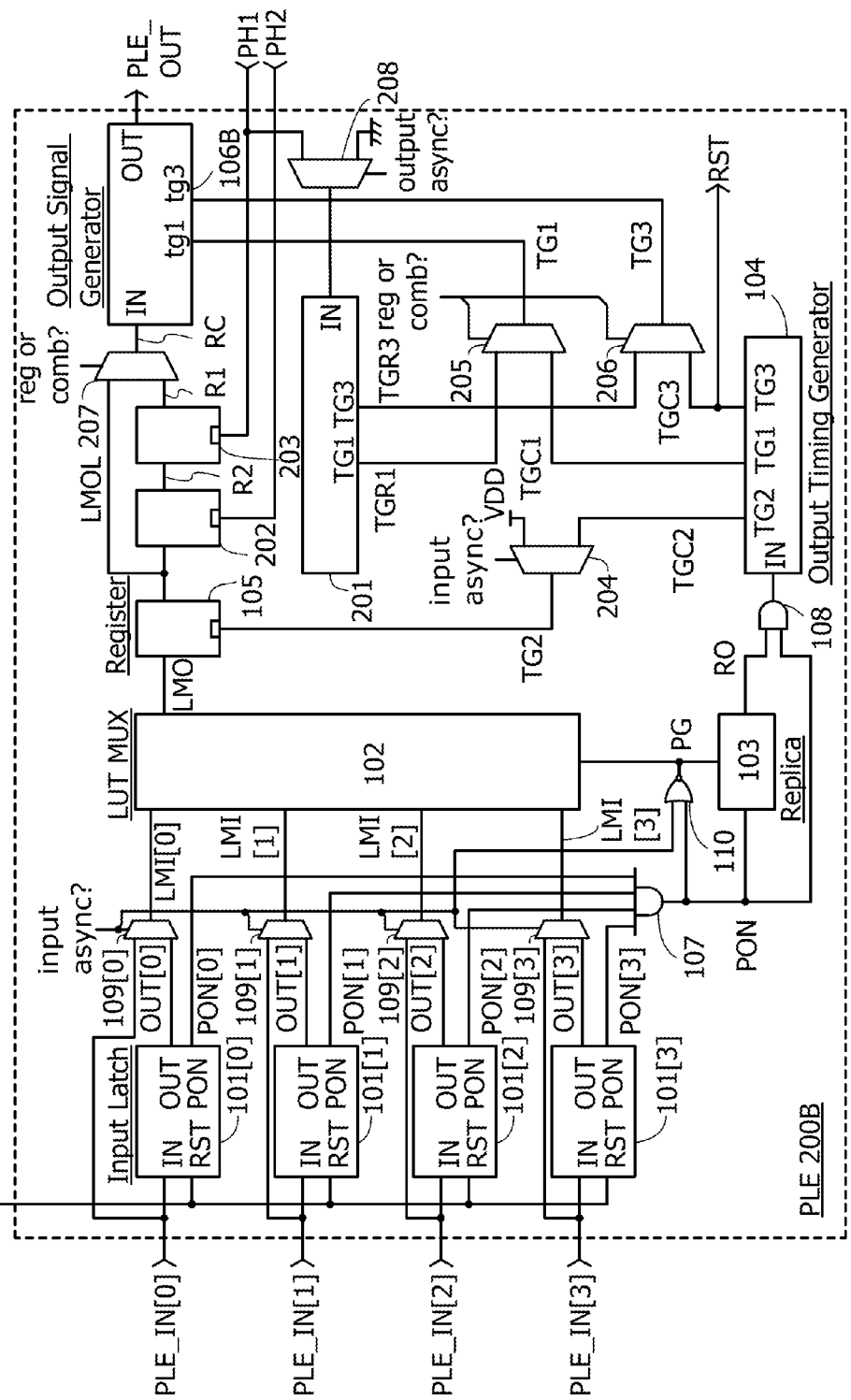
FIG. 17 is a block diagram illustrating one embodiment of the present invention.

FIG. 17 is a block diagram illustrating the configuration of the semiconductor device in one embodiment of the present invention.

A semiconductor device 200B in FIG. 17 includes the latch circuits 101[0] to 101[3], the arithmetic circuit 102, the delay circuit 103, the output timing generation circuit 104, the register 105, the output signal generation circuit 106B, the AND gate 107, the AND gate 108, the multiplexers 109[0] to 109[3], the AND gate 110, and the multiplexer 204 which are described with reference to FIG. 14. In addition, the semiconductor device 200B in FIG. 17 includes an output timing generation circuit 201, registers 202 and 203, and multiplexers 205 to 208.

In the semiconductor device 200B in FIG. 17, power gating of the arithmetic circuit 102 and the delay circuit 103 can be implemented without the need to wait for the period of a global clock signal. Therefore, power gating can be implemented sequentially from a circuit which has completed arithmetic processing; thus, power consumption can be effectively reduced by power gating. The semiconductor device 200B in FIG. 17 can also be configured to output a signal that is synchronous with a clock signal PH1.

The semiconductor device 200B having the configuration in FIG. 17 is effective in the case where a synchronous signal is used as an input or output signal of the semiconductor device. This is particularly effective in the case where an external semiconductor device used in combination with a PLD including a reconfigurable semiconductor device is a synchronous circuit.

The circuit configuration of the semiconductor device 200B in FIG. 17 can be freely changed to both a synchronous circuit and an asynchronous circuit even when a pulse signal or a binary signal is used as an input signal. Therefore, the semiconductor device 200B can serve as a conveniently reconfigurable logic circuit.

Components and operation of the semiconductor device 200B and circuit examples of the components will be described below.

<Components of Semiconductor Device>

FIG. 17 illustrates a circuit configuration of the semiconductor device 200B of this embodiment. Portions similar to those described in Embodiments 1 and 3 are not described in this embodiment, for which the description in the above embodiments can be referred to.

The latch circuits 101[0] to 101[3] are similar to those described in Embodiment 3. That is, when receiving the signals PLE_IN[0] to PLE_IN[3], the latch circuits 101[0] to 101[3] generate the signals PON[0] to PON[3] and the data signals OUT[0] to OUT[3] and are reset by the reset signal RST.

The multiplexers 109[0] to 109[3] are similar to those described in Embodiment 3. That is, the multiplexers 109 [0] to 109[3] select and output the signals OUT[0] to OUT[3] when the signals PLE_IN[0] to PLE_IN[3] are pulse signals, and select and output the signals PLE_IN[0] to PLE_IN[3] when the signals PLE_IN[0] to PLE_IN[3] are binary signals.

The arithmetic circuit 102 is similar to that described in Embodiment 3. That is, the arithmetic circuit 102 conducts arithmetic processing based on the data signals LMI[0] to LMI[3] and outputs the signal LMO.

The AND gate 107 and the NOR gate 110 are similar to those described in Embodiment 3. That is, the AND gate 107 generates the signal PON by conducting an AND operation on the signals PON[0] to PON[3]. The NOR gate 110 has a function of generating the signal PG by conducting a NOR operation on the signal PON and configuration data.

The delay circuit 103 is similar to that described in Embodiment 3. That is, the delay circuit 103 receives the signal PON and generates the signal RO.

The AND gate 108 is similar to that described in Embodiment 3. That is, the AND gate 108 generates the signal DL by conducting an AND operation on the signal PON and the signal RO.

The output timing generation circuit 104 is similar to that described in Embodiment 3. That is, the output timing generation circuit 104 receives the signal DL and generates the signals TGC1 to TGC3.

The register 105 is similar to that described in Embodiment 3. That is, the register 105 latches the signal LMO and outputs the latched signal as the signal LMOL under control of the signal TG2.

The multiplexer 204 is similar to that described in Embodiment 3. That is, the multiplexer 204 selects and outputs the signal TGC2 when the signals PLE_IN[0] to PLE_IN[3] are pulse signals, and selects and outputs the potential VDD, i.e., the high level, when the signals PLE_IN[0] to PLE_IN[3] are binary signals.

The register 202 has a function of latching the signal LMOL and outputting the latched signal as the signal R2 under control of the clock signal PH2. Owing to the register 202, the signal LMOL stored therein can be output as the signal R2 at a predetermined time.

The register 203 has a function of latching the signal R2 and outputting the latched signal as the signal R1 under control of the clock signal PH1. Owing to the register 203, the signal R2 stored therein can be output as the signal R1 at a predetermined time.

The multiplexer 207 has a function of selecting the signal LMOL when a data signal is output asynchronously and selecting the signal R1 when a data signal is output in synchronization with a clock signal, and outputting the selected signal as a signal RC. Owing to the multiplexer 207, an asynchronous signal or a signal synchronous with the clock signal PH1 can be selected and output as the signal PLE_OUT. Note that the term "reg or comb?" in FIG. 17 corresponds to configuration data for selecting a synchronous signal or an asynchronous signal to be output as the signal PLE_OUT. In the case of the synchronous signal, the signal R1 is selected, and in the case of the asynchronous signal, the signal LMOL is selected.

The multiplexer 208 has a function of selecting and outputting the potential GND, i.e., the low level, when the signal PLE_OUT is output as a binary data signal. The multiplexer 208 also has a function of selecting and outputting the clock PH1 as the signal TG1 when the signal PLE_OUT is output as a pulse signal.

The output timing generation circuit 201 has a function of receiving the clock signal PH1 and generating the signals TGR1 and TGR3 when the signal PLE_OUT is output as a pulse signal. The output timing generation circuit 201 receives the low level and keeps the signals TGR1 and TGR3 at the low level when the signal PLE_OUT is output as a binary data signal. The output timing generation circuit 201 has the same circuit configuration as the output timing generation circuit 104. That is, the output timing generation circuit 201 includes RS latches and can output the signals TGR1 and TGR3 which are delayed for certain periods of time from the input of the clock signal PH1. The output timing generation circuit 201 can output the signal TGR1 which is generated with a delay for a certain period of time from the input of the clock signal PH1, and the signal TGR3 which is generated with a further delay for the certain period of time.

The multiplexer 205 has a function of selecting the signal TGC1 when a data signal is output asynchronously and selecting the signal TGR1 when a data signal is output in synchronization with a clock signal, and outputting the selected signal as the signal TG1. Owing to the multiplexer 205, an asynchronous signal or a signal synchronous with the clock signal PH1 can be selected and output as the signal PLE_OUT. In the case of the synchronous signal, the signal TGR1 is selected, and in the case of the asynchronous signal, the signal TGC1 is selected.

The multiplexer 206 has a function of selecting the signal TGC3 when a data signal is output asynchronously and selecting the signal TGR3 when a data signal is output in synchronization with a clock signal, and outputting the selected signal as the signal TG1. Owing to the multiplexer 206, an asynchronous signal or a signal synchronous with the clock signal PH1 can be selected and output as the signal PLE_OUT. In the case of the synchronous signal, the signal TGR3 is selected, and in the case of the asynchronous signal, the signal TGC3 is selected.

The output signal generation circuit 106B has a function of receiving the signal RC and outputting a binary data signal or a pulse signal as the signal PLE_OUT based on the logical value of the signal RC at the time when the signal TG1 and the signal TG3 are set at a high level. When a pulse signal is output, the output signal generation circuit 106B can change the logical value of the signal PLE_OUT by outputting a pulse at the time when the signal TG1 is set at the high level and then outputting a pulse based on the logical value of the signal RC at the time when the signal TG3 is set at the high level.

<Operation of Semiconductor Device>

Figure 18:
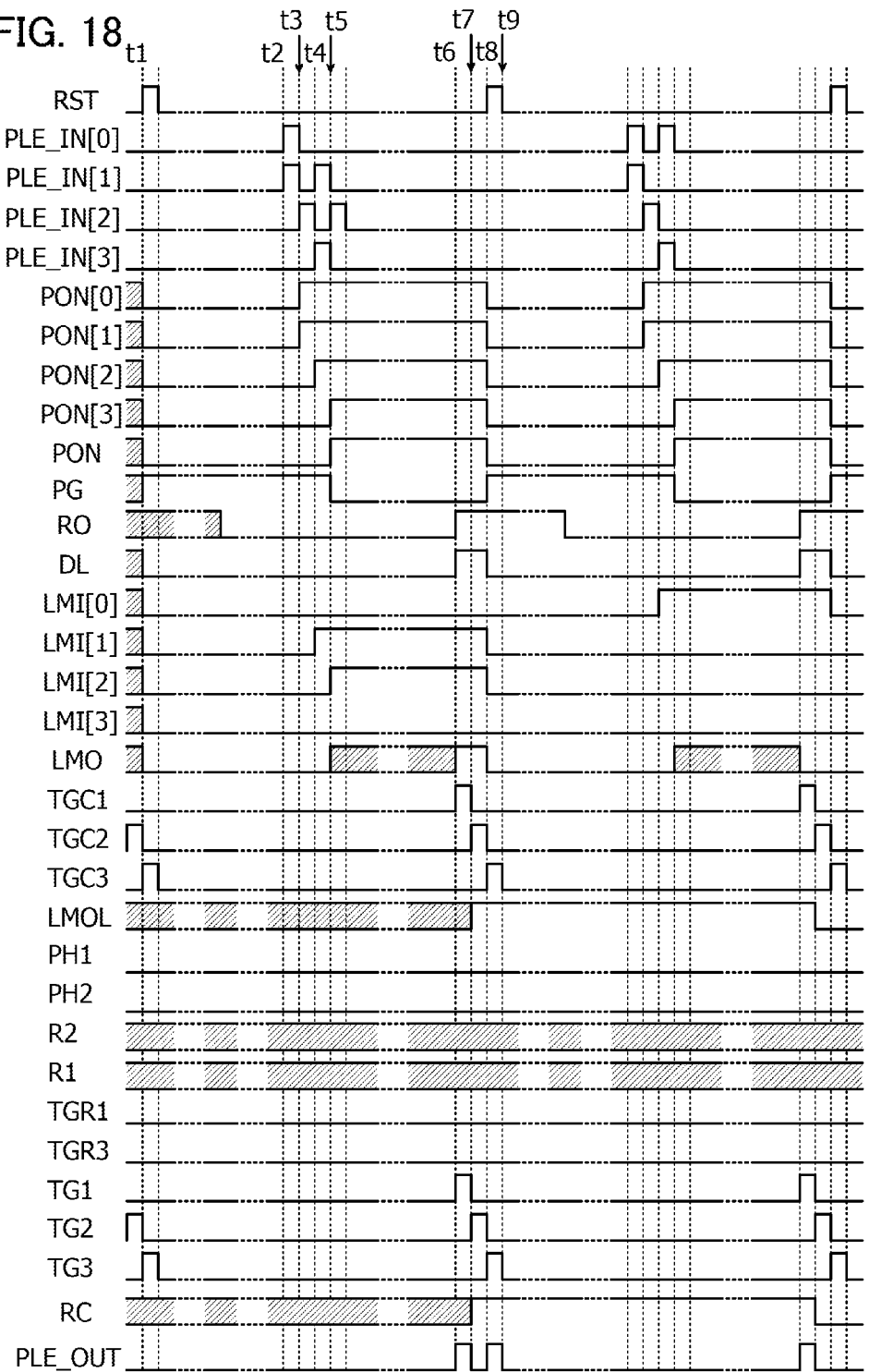
FIG. 18 is a timing chart illustrating one embodiment of the present invention.
Figure 19:
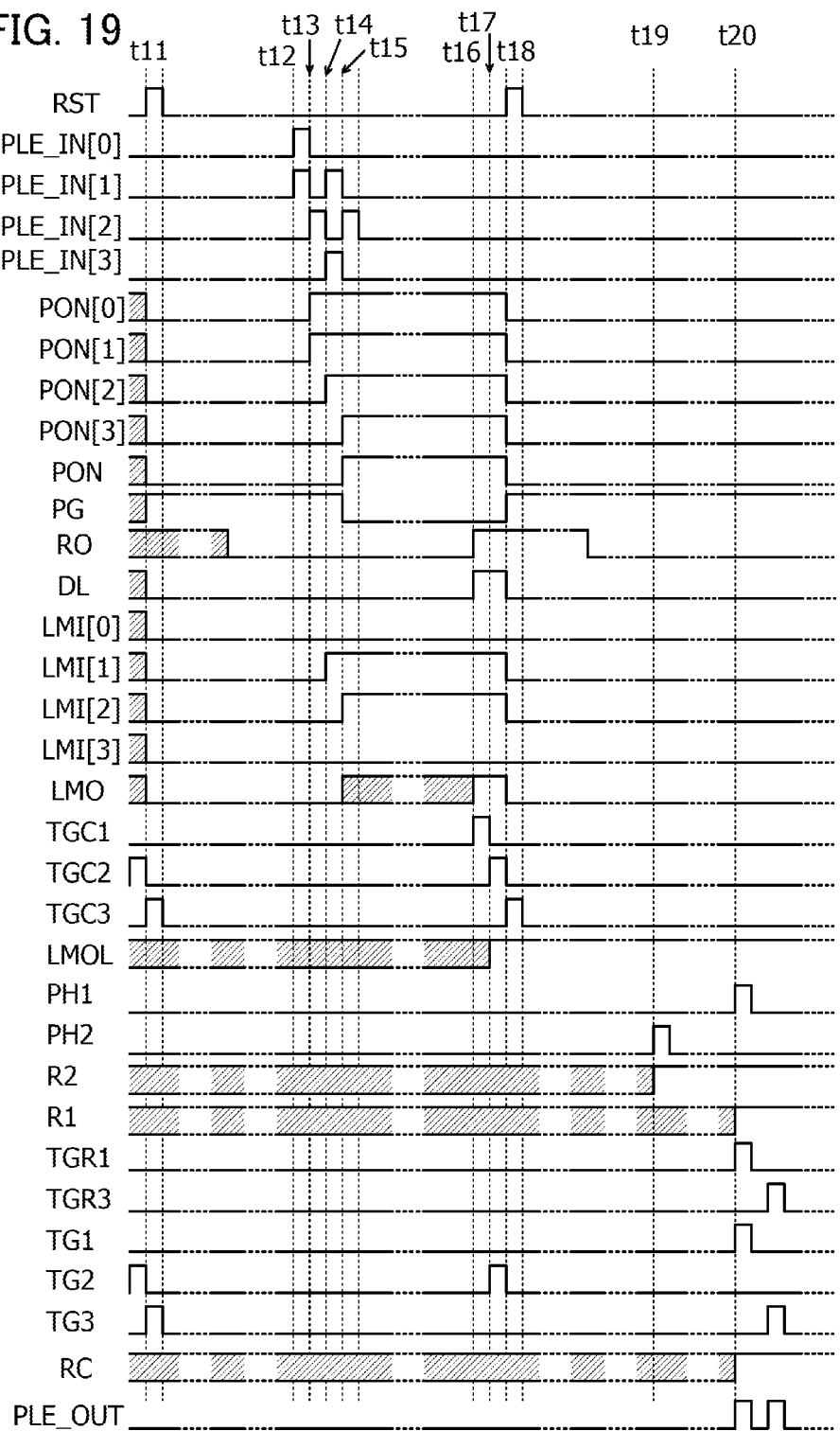
FIG. 19 is a timing chart illustrating one embodiment of the present invention.

FIGS. 18 and 19 are timing charts illustrating each signal in the semiconductor device 200B illustrated in FIG. 17. Note that FIG. 18 is a timing chart illustrating a case where the signal PLE_OUT is output asynchronously, and FIG. 19 is a timing chart illustrating a case where the signal PLE_OUT is output in synchronization with the clock signal PH1. Note that the signals in FIGS. 18 and 19 are used for the semiconductor device 200B illustrated in FIG. 17.

Note that FIGS. 18 and 19 illustrate a particular operation in which the signals PLE_IN[0] to PLE_IN[3] and the signal PLE_OUT are pulse signals. In the above-described case where the signals PLE_IN[0] to PLE_IN[3] and the signal PLE_OUT are binary signals, there is no operation to power off the arithmetic circuit 102 and the delay circuit 103.

Note that selection of signals to be output from the multiplexers 109 [0] to 109[3] and the multiplexer 204 is set in advance with configuration data. In the case where the signals PLE_IN[0] to PLE_IN[3] are pulse signals, the multiplexers 109[0] to 109[3] select the signals OUT[0] to OUT[3] as the data signals LMI[0] to LMI[3]. The multiplexer 204 selects the signal TGC2 as the signal TG2. The multiplexer 208 selects the clock signal PH1.

An operation in a period from time t1 to time t9 in the timing chart illustrated in FIG. 18 is similar to the operation in the period from time T1 to time T9 described with reference to FIG. 15. In this period, since the signal PLE_OUT is asynchronously output, the clock signals PH1 and PH2 each remain at a low level. Thus, the output timing generation circuit 201 does not operate, and the signals TGR1 and TGR3 each remain at a low level. The multiplexer 207 selects the signal LMOL as the signal RC. The multiplexer 205 selects the signal TGC1 as the signal TG1. The multiplexer 206 selects the signal TGC3 as the signal TG3. The signal PLE_OUT is output when a pulse of the signal TG1 or TG3 is input.

An operation in a period from time t11 to time t19 in the timing chart illustrated in FIG. 19 is similar to the operation in the period from time t1 to time t9 described with reference to FIG. 18. A difference is that pulses are output as the clock signal PH2 and the clock signal PH1 at time t19 and time t20, respectively. The registers 202 and 203 output the latched signals R2 and R1 when pulses are output as the clock signals PH2 and PH1. The output timing generation circuit 201 outputs the signal TGR1 and the signal TGR3 which are each generated with a certain period of delay from the clock signal PH1. The multiplexer 207 selects the signal R1 as the signal RC. The multiplexer 205 selects the signal TGR1 as the signal TG1. The multiplexer 206 selects the signal TGR3 as the signal TG3. The signal PLE_OUT is output when a pulse of the signal TG1 or TG3 is input.

According to the above operation, the arithmetic circuit 102 and the delay circuit 103 can be powered on only in a necessary and sufficient period until the arithmetic circuit 102 outputs the operation result, and thus can be powered off for a long period. In addition, the signal PLE_OUT can be output in synchronization with the clock signals.

<Examples of Circuits of Semiconductor Device>

Configuration examples of the latch circuits 101 [0] to 101[3], the output timing generation circuit 104, the output signal generation circuit 106B, the arithmetic circuit 102, and the delay circuit 103 which are included in the semiconductor device 200B are similar to the configurations of the circuits which are included in the semiconductor device 100B described in Embodiment 3.

Embodiment 5

In this embodiment, the OS transistor described in Embodiment 1 will be described.

<Characteristics of OS Transistor>

The off-state current of an OS transistor can be reduced by reducing the concentration of impurities in an oxide semiconductor to make the oxide semiconductor intrinsic or substantially intrinsic. The term "substantially intrinsic" refers to a state where an oxide semiconductor has a carrier density lower than $1 \times 10^{17}/cm^3$, preferably lower than $1 \times 10^{15}/cm^3$, more preferably lower than $1 \times 10^{13}/cm^3$. In the oxide semiconductor, hydrogen, nitrogen, carbon, silicon, and metal elements that are not main components are impurities. For example, hydrogen and nitrogen form donor levels to increase the carrier density.

A transistor using an intrinsic or substantially intrinsic oxide semiconductor has a low carrier density and thus is less likely to have negative threshold voltage. In addition, because of few carrier traps in the oxide semiconductor, the transistor using the oxide semiconductor has small variation in electrical characteristics and high reliability. Furthermore, the transistor using the oxide semiconductor achieves an ultralow off-state current.

Note that the OS transistor with reduced off-state current can exhibit a normalized off-state current per micrometer in channel width of $1 \times 10^{-18}$ A or less, preferably $1 \times 10^{-21}$ A or less, more preferably $1 \times 10^{-24}$ A or less at room temperature (approximately 25° C.), or $1 \times 10^{-15}$ A or less, preferably $1 \times 10^{-18}$ A or less, more preferably $1 \times 10^{-21}$ A or less at 85° C.

<Off-State Current>

Unless otherwise specified, the off-state current in this specification refers to a drain current of a transistor in the off state (also referred to as non-conduction state and cutoff state). Unless otherwise specified, the off state of an n-channel transistor means that the voltage between its gate and source ($V_{gs}$: gate-source voltage) is lower than the threshold voltage $V_{th}$, and the off state of a p-channel transistor means that the gate-source voltage $V_{gs}$ is higher than the threshold voltage $V_{th}$. For example, the off-state current of an n-channel transistor sometimes refers to a drain current that flows when the gate-source voltage $V_{gs}$ is lower than the threshold voltage $V_{th}$.

The off-state current of a transistor depends on $V_{gs}$ in some cases. For this reason, when there is $V_{gs}$ at which the off-state current of a transistor is lower than or equal to I, it may be said that the off-state current of the transistor is lower than or equal to I. The off-state current of a transistor may refer to off-state current at given $V_{gs}$, off-state current at $V_{gs}$ in a given range, or off-state current at $V_{gs}$ at which sufficiently low off-state current is obtained.

As an example, the assumption is made of an n-channel transistor where the threshold voltage $V_{th}$ is 0.5 V and the drain current is $1 \times 10^{-9}$ A at $V_{gs}$ of 0.5 V, $1 \times 10^{-13}$ A at $V_{gs}$ of 0.1 V, $1 \times 10^{-19}$ A at $V_{gs}$ of $-0.5$ V, and $1 \times 10^{-22}$ A at $V_{gs}$ of $-0.8$ V. The drain current of the transistor is $1 \times 10^{-19}$ A or lower at $V_{gs}$ of $-0.5$ V or at $V_{gs}$ in the range of $-0.8$ V to $-0.5$ V; therefore, it can be said that the off-state current of the transistor is $1 \times 10^{-19}$ A or lower. Since there is $V_{gs}$ at which the drain current of the transistor is $1 \times 10^{-22}$ A or lower, it may be said that the off-state current of the transistor is $1 \times 10^{-22}$ A or lower.

In this specification, the off-state current of a transistor with a channel width W is sometimes represented by a current value in relation to the channel width W or by a current value per given channel width (e.g., 1 μm). In the latter case, the unit of off-state current may be represented by current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like is used (e.g., temperature in the range of 5° C. to 35° C.). When there is $V_{gs}$ at which the off-state current of a transistor at room temperature, 60° C., 85° C., 95° C., 125° C., a temperature at which the reliability of a semiconductor device or the like including the transistor is ensured, or a temperature at which the semiconductor device or the like is used (e.g., temperature in the range of 5° C. to 35° C.) is lower than or equal to I, it may be said that the off-state current of the transistor is lower than or equal to I.

The off-state current of a transistor depends on voltage $V_{ds}$ between its drain and source in some cases. Unless otherwise specified, the off-state current in this specification may be an off-state current at $V_{ds}$ with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at $V_{ds}$ at which the reliability of a semiconductor device or the like including the transistor is ensured or $V_{ds}$ used in the semiconductor device or the like. When there is $V_{gs}$ at which the off-state current of a transistor is lower than or equal to I at given $V_{ds}$, it may be said that the off-state current of the transistor is lower than or equal to I. Here, given $V_{ds}$ is, for example, 0.1 V, 0.8 V, 1 V, 1.2 V, 1.8 V, 2.5 V, 3 V, 3.3 V, 10 V, 12 V, 16 V, 20 V, $V_{ds}$ at which the reliability of a semiconductor device or the like including the transistor is ensured, or Vas used in the semiconductor device or the like.

In the above description of off-state current, a drain may be replaced with a source. That is, the off-state current sometimes refers to a current that flows through a source of a transistor in the off state.

In this specification, the term "leakage current" sometimes expresses the same meaning as off-state current.

In this specification, the off-state current sometimes refers to a current that flows between a source and a drain when a transistor is off, for example.

<Composition of Oxide Semiconductor>

Note that at least indium (In) or zinc (Zn) is preferably contained as an oxide semiconductor used for the semiconductor layer of the OS transistor. In particular, In and Zn are preferably contained. A stabilizer for strongly bonding oxygen is preferably contained in addition to In and Zn. As a stabilizer, at least one of gallium (Ga), tin (Sn), zirconium (Zr), hafnium (Hf), and aluminum (Al) may be contained.

As another stabilizer, the oxide semiconductor may contain one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor used for the semiconductor layer of the transistor, any of the following can be used, for example: indium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—Zr—Zn-based oxide, In—Ti—Zn-based oxide, In—Sc—Zn-based oxide, In—Y—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

For example, it is possible to use an In—Ga—Zn-based oxide with an atomic ratio of In:Ga:Zn=1:1:1, 3:1:2, or 2:1:3 or an oxide with an atomic ratio close to the above atomic ratios.

<Impurity in Oxide Semiconductor>

If an oxide semiconductor film forming the semiconductor layer contains a large amount of hydrogen, the hydrogen and the oxide semiconductor are bonded to each other, so that part of the hydrogen serves as a donor and causes generation of an electron which is a carrier. As a result, the threshold voltage of the transistor shifts in the negative direction. It is therefore preferable that after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is sometimes reduced by the dehydration treatment (dehydrogenation treatment). For that reason, it is preferable that oxygen be added to the oxide semiconductor film to fill oxygen vacancies increased by the dehydration treatment (dehydrogenation treatment).

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film that is extremely close to an i-type oxide semiconductor film. Note that "substantially intrinsic" means that the oxide semiconductor film contains extremely few (close to zero) carriers derived from a donor and has a carrier density which is $1\times10^{17}/cm^3$ or lower, $1\times10^{16}/cm^3$ or lower, $1\times10^{15}/cm^3$ or lower, $1\times10^{14}/cm^3$ or lower, or $1\times10^{13}/cm^3$ or lower.

<Structure of Oxide Semiconductor>

Next, a structure of an oxide semiconductor will be described.

In this specification, the term "parallel" indicates that the angle formed between two straight lines is greater than or equal to $-10°$ and less than or equal to $10°$, and accordingly also includes the case where the angle is greater than or equal to $-5°$ and less than or equal to $5°$. In addition, the term "substantially parallel" indicates that the angle formed between two straight lines is greater than or equal to $-30°$ and less than or equal to $30°$. The term "perpendicular" indicates that the angle formed between two straight lines is greater than or equal to $80°$ and less than or equal to $100°$, and accordingly also includes the case where the angle is greater than or equal to $85°$ and less than or equal to $95°$. In addition, the term "substantially perpendicular" indicates that the angle formed between two straight lines is greater than or equal to $60°$ and less than or equal to $120°$.

In this specification, trigonal and rhombohedral crystal systems are included in a hexagonal crystal system.

An oxide semiconductor film is classified into a non-single-crystal oxide semiconductor film and a single crystal oxide semiconductor film. Alternatively, an oxide semiconductor is classified into, for example, a crystalline oxide semiconductor and an amorphous oxide semiconductor.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. In addition, examples of a crystalline oxide semiconductor include a single crystal oxide semiconductor, a CAAC-OS, a polycrystalline oxide semiconductor, and a microcrystalline oxide semiconductor.

First, a CAAC-OS film will be described.

The CAAC-OS film is one of oxide semiconductor films having a plurality of c-axis aligned crystal parts.

In a combined analysis image (also referred to as a high-resolution TEM image) of a bright-field image and a diffraction pattern of a CAAC-OS film, which is obtained using a transmission electron microscope (TEM), a plurality of crystal parts can be observed. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology reflecting unevenness of a surface where the CAAC-OS film is formed (hereinafter, a surface where the CAAC-OS film is formed is also referred to as a formation surface) or a top surface of the CAAC-OS film, and is arranged parallel to the formation surface or the top surface of the CAAC-OS film.

On the other hand, according to the high-resolution plan-view TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an InGaZnO$_4$ crystal is analyzed by an out-of-plane method, a peak may also be observed when 2θ is around 36°, in addition to the peak at 2θ of around 31°. The peak at 2θ of around 36° indicates that a crystal having no c-axis alignment is included in part of the CAAC-OS film. It is preferable that in the CAAC-OS film, a peak appear when 2θ is around 31° and that a peak not appear when 2θ is around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a highly purified intrinsic or substantially highly purified intrinsic state. A highly purified intrinsic or substantially highly purified intrinsic oxide semiconductor film has few carrier generation sources, and thus can have a low carrier density. Therefore, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released and might behave like fixed electric charge. Thus, the transistor including the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film will be described.

A microcrystalline oxide semiconductor film has a region in which a crystal part is observed and a region in which a crystal part is not clearly observed in a high-resolution TEM image. In most cases, the size of a crystal part included in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm, is specifically referred to as nanocrystal (nc). An oxide semiconductor film including nanocrystal is referred to as an nc-OS (nanocrystalline oxide semiconductor) film. In a high-resolution TEM image of the nc-OS film, for example, a grain boundary is not clearly observed in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the size of a crystal part, a peak indicating a crystal plane does not appear. Further, a halo pattern is shown in a selected-area electron diffraction pattern of the nc-OS film obtained by using an electron beam having a probe diameter (e.g., 50 nm or larger) larger than the size of a crystal part. Meanwhile, spots are shown in a nanobeam electron diffraction pattern of the nc-OS film obtained by using an electron beam having a probe diameter close to or smaller than the size of a crystal part. Furthermore, in a nanobeam electron diffraction pattern of the nc-OS film, regions with high luminance in a circular (ring) pattern are shown in some cases. Moreover, in a nanobeam electron diffraction pattern of the nc-OS film, a plurality of spots are shown in a ring-like region in some cases.

The nc-OS film is an oxide semiconductor film that has high regularity as compared with an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is observed when the amorphous oxide semiconductor film is subjected to electron diffraction. Furthermore, a spot is not observed and a halo pattern appears when the amorphous oxide semiconductor film is subjected to nanobeam electron diffraction.

Note that an oxide semiconductor film may have a structure having physical properties intermediate between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be observed. Furthermore, in the high-resolution TEM image, there are a region where a crystal part is clearly observed and a region where a crystal part is not observed. In some cases, growth of the crystal part occurs due to the crystallization of the a-like OS film, which is induced by a slight amount of electron beam employed in the TEM observation. In contrast, in the nc-OS film that has good quality, crystallization hardly occurs by a slight amount of electron beam used for TEM observation.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the $InGaZnO_4$ crystal.

Furthermore, the density of an oxide semiconductor film varies depending on the structure in some cases. For example, when the composition of an oxide semiconductor film is determined, the structure of the oxide semiconductor film can be expected by comparing the density of the oxide semiconductor film with the density of a single crystal oxide semiconductor having the same composition as the oxide semiconductor film. For example, the density of the a-like OS film is higher than or equal to 78.6% and lower than 92.3% of the density of the single crystal oxide semiconductor having the same composition. For example, the density of each of the nc-OS film and the CAAC-OS film is higher than or equal to 92.3% and lower than 100% of the density of the single crystal oxide semiconductor having the same composition. Note that it is difficult to deposit an oxide semiconductor film having a density of lower than 78% of the density of the single crystal oxide semiconductor.

Specific examples of the above description are given. For example, in the case of an oxide semiconductor film having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor film having an atomic ratio of In:Ga:Zn=1:1:1, the density of the a-like OS film is higher than or equal to 5.0 $g/cm^3$ and lower than 5.9 $g/cm^3$. For example, in the case of the oxide semiconductor film having an atomic ratio of In:Ga:Zn=1:1:1, the density of each of the nc-OS film and the CAAC-OS film is higher than or equal to 5.9 $g/cm^3$ and lower than 6.3 $g/cm^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

Note that an oxide semiconductor film may be a stacked film including two or more films of an amorphous oxide semiconductor film, an a-like OS film, a microcrystalline oxide semiconductor film, and a CAAC-OS film, for example.

As described above, the OS transistor can achieve highly favorable off-state current characteristics.

Embodiment 6

In this embodiment, an example of a cross-sectional structure of a transistor used in a semiconductor device of one embodiment of the disclosed invention will be described with reference to drawings.

Figure 20:
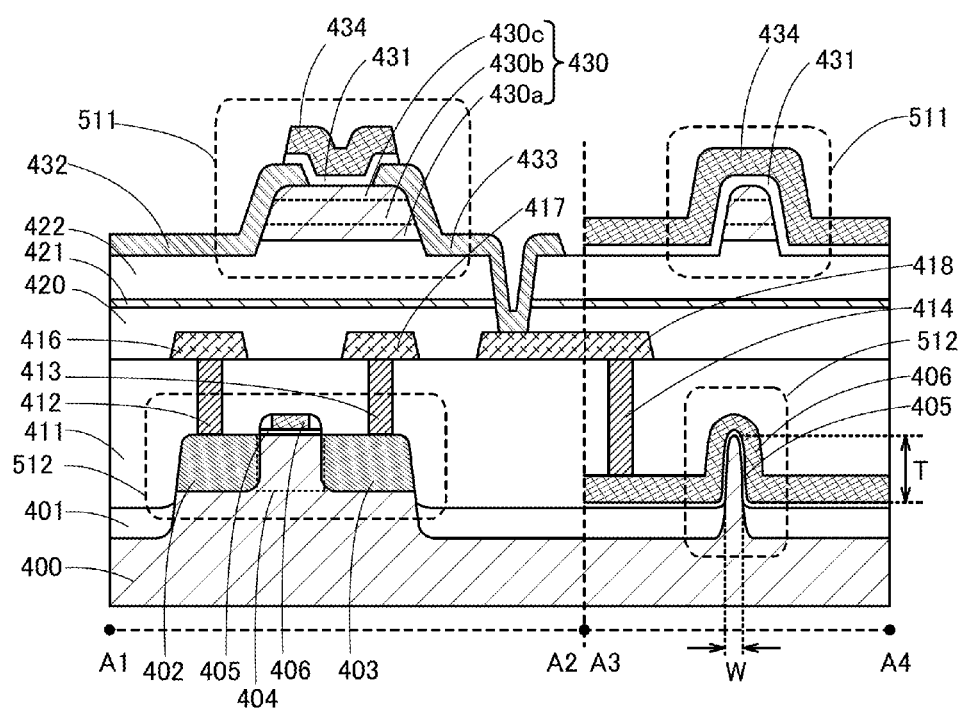
FIG. 20 is a cross-sectional view illustrating one embodiment of the present invention.

FIG. 20 illustrates an example of part of a cross-sectional structure of a circuit portion according to one embodiment of the invention. FIG. 20 illustrates an example of a cross-sectional structure of the transistor 511 and the transistor 512 illustrated in FIG. 9A in Embodiment 1. A region along dashed line A1-A2 shows a structure of the transistor 511 and the transistor 512 in the channel length direction, and a region along dashed line A3-A4 shows a structure of the transistor 511 and the transistor 512 in the channel width direction. Note that in one embodiment of the present invention, the channel length direction of the transistor 511 is not necessarily aligned with the channel length direction of the transistor 512.

In FIG. 20, the transistor 511 including a channel formation region in an oxide semiconductor film is formed over the transistor 512 including a channel formation region in a single crystal silicon substrate.

The transistor 512 may include the channel formation region in a semiconductor film or a semiconductor substrate of silicon, germanium, or the like in an amorphous, microcrystalline, polycrystalline, or single crystal state. Alternatively, the transistor 512 may include the channel formation region in an oxide semiconductor film or an oxide semiconductor substrate. In the case where the transistors each include a channel formation region in an oxide semiconductor film or an oxide semiconductor substrate, the transistor 511 is not necessarily stacked over the transistor 512, and the transistor 511 and the transistor 512 may be formed in the same layer.

In the case where the transistor 512 is formed using a thin silicon film, any of the following can be used in the thin film: amorphous silicon formed by a sputtering method or a vapor phase growth method such as a plasma-enhanced CVD method; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A substrate 400 where the transistor 512 is formed can be, for example, a silicon substrate, a germanium substrate, or a silicon germanium substrate. In FIG. 20, a single crystal silicon substrate is used as the substrate 400.

The transistor 512 is electrically isolated by an element isolation method. As the element isolation method, a trench isolation method (a shallow trench isolation (STI) method) or the like can be used. FIG. 20 illustrates an example where the trench isolation method is used to electrically isolate the transistor 512. Specifically, in FIG. 20, the transistor 512 is electrically isolated by element isolation using an element isolation region 401 formed in such a manner that an insulator including silicon oxide or the like is buried in a trench formed in the substrate 400 by etching or the like and then the insulator is removed partly by etching or the like.

In a projection of the substrate 400 that exists in a region other than the trench, an impurity region 402 and an impurity region 403 of the transistor 512 and a channel formation region 404 placed between the impurity regions 402 and 403 are provided. Further, the transistor 512 includes an insulating film 405 covering the channel formation region 404 and a gate electrode 406 that overlaps with the channel formation region 404 with the insulating film 405 provided therebetween.

In the transistor 512, a side portion and an upper portion of the projection in the channel formation region 404 overlap with the gate electrode 406 with the insulating film 405 positioned therebetween, so that carriers flow in a wide area including the side portion and the upper portion of the channel formation region 404. Therefore, an area over the substrate occupied by the transistor 512 can be reduced, and the number of transferred carriers in the transistor 512 can be increased. As a result, the on-state current and field-effect mobility of the transistor 512 are increased. Suppose the length in the channel width direction (channel width) of the projection in the channel formation region 404 is W, and the thickness of the projection in the channel formation region 404 is T. When the aspect ratio of the thickness T to the channel width W is high, a region where carriers flow becomes larger. Thus, the on-state current of the transistor 512 can be further increased and the field-effect mobility of the transistor 512 can be further increased.

Note that when the transistor 512 is formed using a bulk semiconductor substrate, the aspect ratio is preferably 0.5 or more, further preferably 1 or more.

An insulating film 411 is provided over the transistor 512. Openings are formed in the insulating film 411. Conductive films 412 and 413 that are electrically connected to the impurity regions 402 and 403, respectively, and a conductive film 414 that is electrically connected to the gate electrode 406 are formed in the openings.

The conductive film 412 is electrically connected to a conductive film 416 formed over the insulating film 411. The conductive film 413 is electrically connected to a conductive film 417 formed over the insulating film 411. The conductive film 414 is electrically connected to a conductive film 418 formed over the insulating film 411.

An insulating film 420 is provided over the conductive films 416 to 418. An insulating film 421 having a blocking effect of preventing diffusion of oxygen, hydrogen, and water is provided over the insulating film 420. As the insulating film 421 has higher density and becomes denser or has a fewer dangling bonds and becomes more chemically stable, the insulating film 421 has a higher blocking effect. The insulating film 421 that has the effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating film 421 having an effect of blocking diffusion of hydrogen and water can be formed using, for example, silicon nitride or silicon nitride oxide.

An insulating film 422 is provided over the insulating film 421, and the transistor 511 is provided over the insulating film 422.

The transistor 511 includes, over the insulating film 422, a semiconductor film 430 including an oxide semiconductor, conductive films 432 and 433 functioning as source and drain electrodes and electrically connected to the semiconductor film 430, a gate insulating film 431 covering the semiconductor film 430, and a gate electrode 434 overlapping with the semiconductor film 430 with the gate insulating film 431 positioned therebetween. Note that an opening is formed in the insulating films 420 to 422. The conductive film 433 is connected to the conductive film 418 in the opening.

Note that in FIG. 20, the transistor 511 includes at least the gate electrode 434 on one side of the semiconductor film 430, and may further include a gate electrode overlapping with the semiconductor film 430 with the insulating film 422 positioned therebetween.

In the case where the transistor 511 has a pair of gate electrodes, one of the gate electrodes may be supplied with a signal for controlling the on/off state, and the other of the gate electrodes may be supplied with a potential from another wiring. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 20, the transistor 511 has a single-gate structure where one channel formation region corresponding to one gate electrode 434 is provided. However, the transistor 511 may have a multi-gate structure where a plurality of electrically connected gate electrodes are provided so that a plurality of channel formation regions are included in one active layer.

FIG. 20 illustrates an example in which the semiconductor film 430 included in the transistor 511 includes oxide semiconductor films 430a to 430c that are stacked in this order over the insulating film 422. Note that in one embodiment of the present invention, the semiconductor film 430 of the transistor 511 may be formed using a single-layer metal oxide film.

The insulating film 422 preferably has a function of supplying part of oxygen to the oxide semiconductor films 430a to 430c by heating. It is preferable that the number of defects in the insulating film 422 be small, and typically the spin density at g=2.001 due to a dangling bond of silicon be lower than or equal to $1 \times 10^{18}$ spins/cm$^3$. The spin density is measured by electron spin resonance (ESR) spectroscopy.

The insulating film 422, which has a function of supplying part of oxygen to the oxide semiconductor films 430a to 430c by heating, is preferably an oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 422 can be formed by a plasma CVD (chemical vapor deposition) method, a sputtering method, or the like.

Note that in this specification, oxynitride contains more oxygen than nitrogen, and nitride oxide contains more nitrogen than oxygen.

Note that in the transistor 511 illustrated in FIG. 20, the gate electrode 434 overlaps with end portions of the oxide semiconductor film 430b including a channel region that do not overlap with the conductive films 432 and 433, i.e., end portions of the oxide semiconductor film 430b that are in a region different from a region where the conductive films 432 and 433 are located. When the end portions of the oxide semiconductor film 430b are exposed to plasma by etching for forming the end portions, a chlorine radical, a fluorine radical, or other radicals generated from an etching gas are easily bonded to a metal element contained in an oxide semiconductor. For this reason, it can be considered that, in the end portions of the oxide semiconductor film, oxygen bonded to the metal element is easily released, so that an oxygen vacancy is easily formed; thus, the end portions of the oxide semiconductor film easily have n-type conductivity. However, an electric field applied to the end portions can be controlled by controlling the potential of the gate electrode 434 because the end portions of the oxide semiconductor film 430b that do not overlap with the conductive films 432 and 433 overlap with the gate electrode 434 in the transistor 511 illustrated in FIG. 20. Consequently, current that flows between the conductive films 432 and 433 through the end portions of the oxide semiconductor film 430b can be controlled by the potential applied to the gate electrode 434. Such a structure of the transistor 511 is referred to as a surrounded channel (s-channel) structure.

With the s-channel structure, specifically, when a potential at which the transistor 511 is turned off is supplied to the gate electrode 434, the amount of off-state current that flows between the conductive films 432 and 433 through the end portions can be reduced. For this reason, in the transistor 511, even when the distance between the conductive films 432 and 433 at the end portions of the oxide semiconductor film 430b is reduced as a result of reducing the channel length to obtain high on-state current, the transistor 511 can have low off-state current. Consequently, with the short channel length, the transistor 511 can have high on-state current when in an on state and low off-state current when in an off state.

With the s-channel structure, specifically, when a potential at which the transistor 511 is turned on is supplied to the gate electrode 434, the amount of current that flows between the conductive films 432 and 433 through the end portions of the oxide semiconductor film 430b can be increased. The current contributes to an increase in the field-effect mobility and an increase in the on-state current of the transistor 511. When the end portions of the oxide semiconductor film 430b overlap with the gate electrode 434, carriers flow in a wide region of the oxide semiconductor film 430b without being limited to a region in the vicinity of the interface between the oxide semiconductor film 430b and the gate insulating film 431, which results in an increase in the amount of carrier movement in the transistor 511. As a result, the on-state current of the transistor 511 is increased, and the field-effect mobility is increased to greater than or equal to 10 $cm^2/V \cdot s$ or to greater than or equal to 20 $cm^2/V \cdot s$, for example. Note that here, the field-effect mobility is not an approximate value of the mobility as the physical property of the oxide semiconductor film but is the apparent field-effect mobility in a saturation region of the transistor, which is an index of current drive capability.

Figure 21:
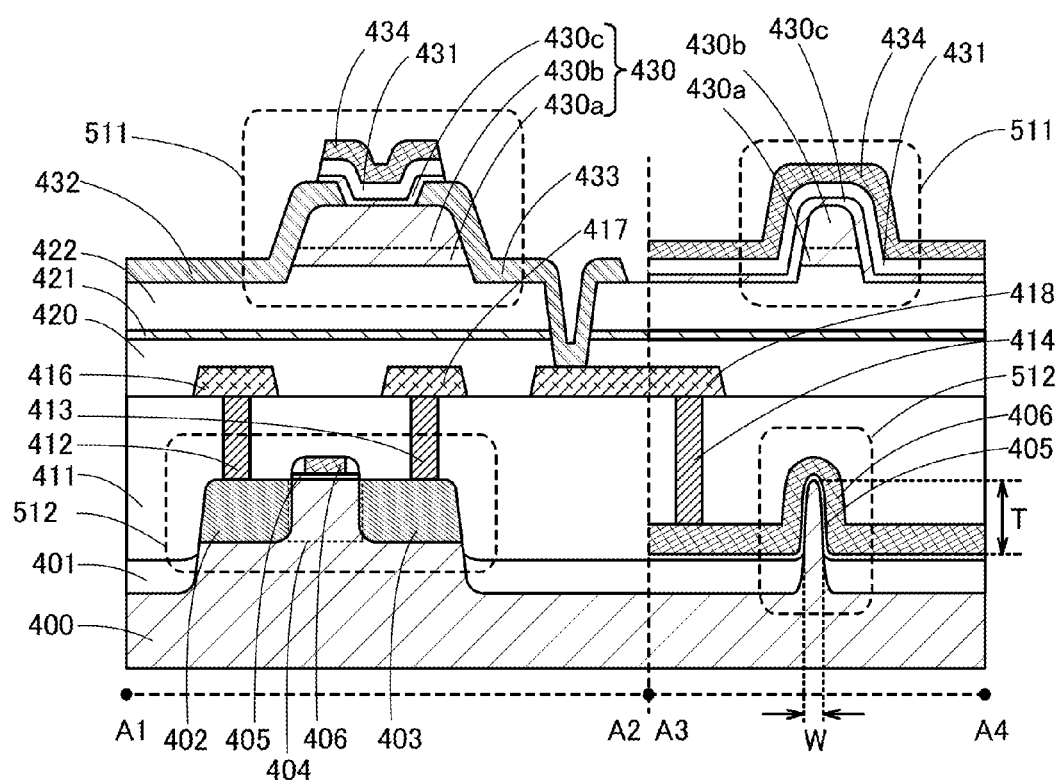
FIG. 21 is a cross-sectional view illustrating one embodiment of the present invention.

Although this embodiment is described with reference to FIG. 20, one embodiment of the present invention is not limited to this structure. For example, a structure illustrated in FIG. 21 may be employed.

Embodiment 7

In this embodiment, application examples of the semiconductor device described in the foregoing embodiment, which functions as a reconfigurable circuit, to an electronic component and to an electronic device including the electronic component will be described with reference to FIGS. 22A and 22B and FIGS. 23A to 23E.

Figure 22A:
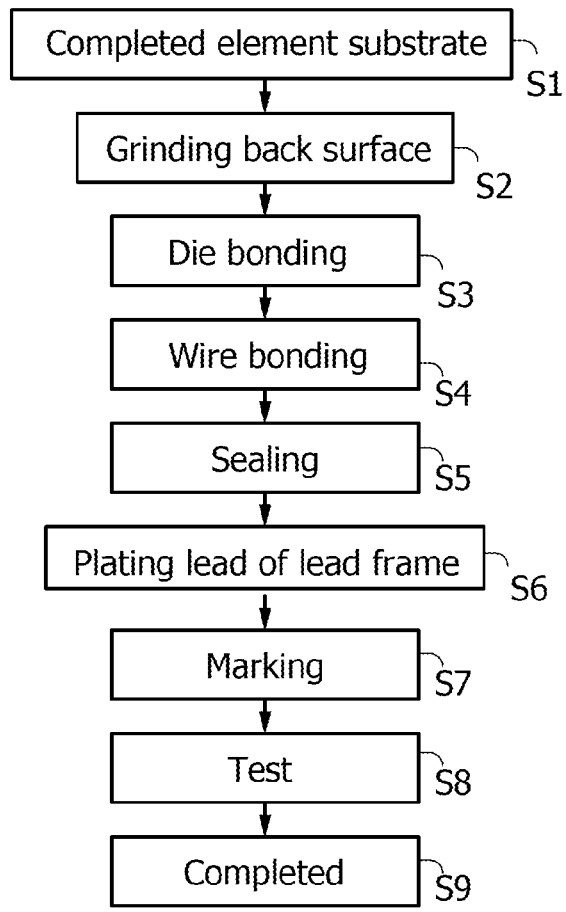
FIG. 22A is a flow chart illustrating steps of manufacturing an electronic component.

FIG. 22A shows an example where the semiconductor device described in the foregoing embodiment, which functions as a reconfigurable circuit, is used to make an electronic component. Note that an electronic component is also referred to as semiconductor package or IC package. For the electronic component, there are various standards and names corresponding to the direction of terminals or the shape of terminals; hence, one example of the electronic component will be described in this embodiment.

A circuit portion including the transistors illustrated in FIG. 20 of Embodiment 6 is completed by integrating detachable components on a printed circuit board through an assembly process (post-process).

The post-process can be completed through steps shown in FIG. 22A. Specifically, after an element substrate obtained in the preceding process is completed (Step S1), a back surface of the substrate is ground (Step S2). The substrate is thinned in this step to reduce warpage or the like of the substrate in the preceding process and to reduce the size of the component itself.

A dicing step of grinding the back surface of the substrate and separating the substrate into a plurality of chips is performed. Then, a die bonding step of individually picking up separate chips to be mounted on and bonded to a lead frame is performed (Step S3). In this die bonding step, the chip is bonded to the lead frame by an appropriate method depending on a product, for example, bonding with a resin or a tape. Note that in the die bonding step, a chip may be mounted on and bonded to an interposer.

Next, wire bonding for electrically connecting a lead of the lead frame and an electrode on a chip through a metal wire is performed (Step S4). As a metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, thereby reducing damage to the circuit portion and the wire embedded in the component caused by external mechanical force as well as reducing deterioration of characteristics due to moisture or dust.

Subsequently, the lead of the lead frame is plated. Then, the lead is cut and processed into a predetermined shape (Step S6). With the plating process, corrosion of the lead can be prevented, and soldering for mounting the electronic component on a printed circuit board in a later step can be performed with higher reliability.

Next, printing process (marking) is performed on a surface of the package (Step S7). Then, through a final test step (Step S8), the electronic component including the semiconductor device, which functions as a reconfigurable circuit, is completed (Step S9).

Since the electronic component described above includes the semiconductor device of the foregoing embodiment, which functions as a reconfigurable circuit, it is possible to reduce the power consumption and the number of wirings between circuits of the electronic component.

Figure 22B:
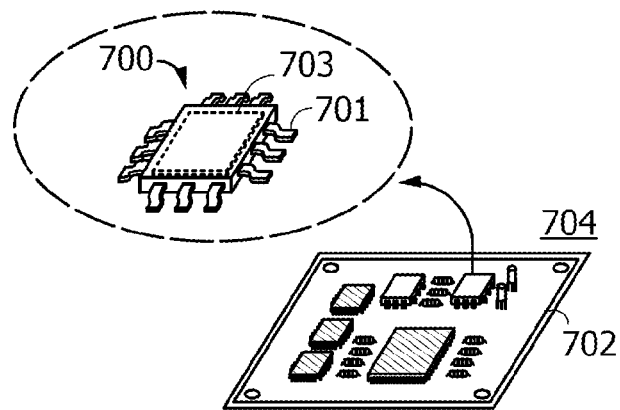
FIG. 22B is a perspective schematic view of the electronic component.

FIG. 22B is a perspective schematic diagram of a completed electronic component. FIG. 22B shows a perspective schematic diagram of a quad flat package (QFP) as an example of the electronic component. An electronic component 700 illustrated in FIG. 22B includes a lead 701 and a circuit portion 703. The electronic component 700 in FIG. 22B is, for example, mounted on a printed circuit board 702. When a plurality of electronic components 700 are used in combination and electrically connected to each other over the printed wiring board 702, the electronic components 700 can be mounted inside an electronic device. The completed circuit board 704 is provided in an electronic device or the like.

Next, the description is made on applications of the above electronic component to electronic devices such as a computer, a portable information terminal (including a mobile phone, a portable game machine, and an audio reproducing device), electronic paper, a television device (also referred to as television or television receiver), and a digital video camera.

Figure 23A:
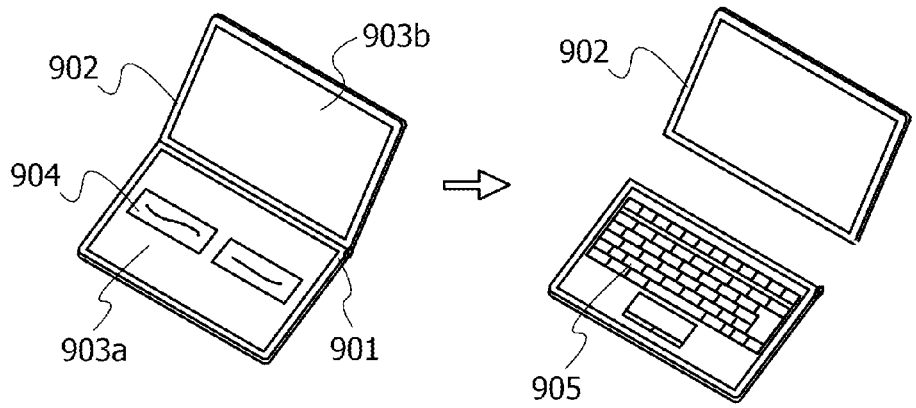
FIGS. 23A to 23E each illustrate an electronic device including an electronic component.

FIG. 23A illustrates a portable information terminal that includes a housing 901, a housing 902, a first display portion 903a, a second display portion 903b, and the like. At least one of the housings 901 and 902 includes the electronic component including the semiconductor device of the foregoing embodiment, which functions as a reconfigurable circuit. Thus, it is possible to obtain a portable information terminal with reduced power consumption and with a reduced number of wirings between circuits.

Note that the first display portion 903a is a panel having a touch input function, and for example, as illustrated in the left of FIG. 23A, which of "touch input" and "keyboard input" is performed can be selected with a selection button 904 displayed on the first display portion 903a. Since selection buttons with a variety of sizes can be displayed, the information terminal can be easily used by people of any generation. For example, when "keyboard input" is selected, a keyboard 905 is displayed on the first display portion 903a as illustrated in the right of FIG. 23A. Thus, letters can be input quickly by key input as in the case of using a conventional information terminal, for example.

One of the first display portion 903a and the second display portion 903b can be detached from the portable information terminal as shown in the right of FIG. 23A. Providing the second display portion 903b with a touch input function makes the information terminal convenient to carry because the weight can be further reduced and the information terminal can be operated with one hand while the other hand supports the housing 902.

The portable information terminal in FIG. 23A can be equipped with a function of displaying a variety of information (e.g., a still image, a moving image, and a text image); a function of displaying a calendar, a date, the time, or the like on the display portion; a function of operating or editing information displayed on the display portion; a function of controlling processing by various kinds of software (programs); and the like. Furthermore, an external connection terminal (an earphone terminal, a USB terminal, or the like), a recording medium insertion portion, and the like may be provided on the back surface or the side surface of the housing.

The portable information terminal illustrated in FIG. 23A may transmit and receive data wirelessly. Through wireless communication, desired book data or the like can be purchased and downloaded from an e-book server.

In addition, the housing 902 illustrated in FIG. 23A may be equipped with an antenna, a microphone function, or a wireless communication function to be used as a mobile phone.

Figure 23B:
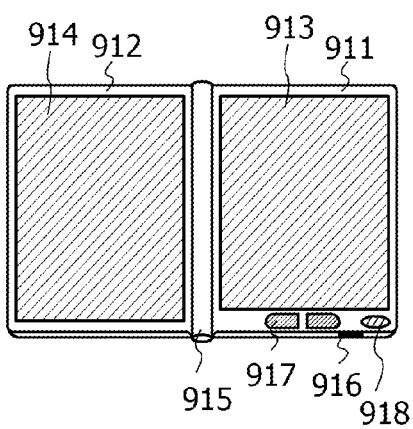

FIG. 23B illustrates an e-book reader in which electronic paper is incorporated. The e-book reader has two housings of a housing 911 and a housing 912. The housing 911 and the housing 912 are provided with a display portion 913 and a display portion 914, respectively. The housings 911 and 912 are connected by a hinge 915 and can be opened or closed with the hinge 915 as an axis. The housing 911 is provided with a power switch 916, an operation key 917, a speaker 918, and the like. The electronic component including the semiconductor device, which functions as a reconfigurable circuit, is provided in at least one of the housings 911 and 912. Consequently, it is possible to obtain an e-book reader with reduced power consumption and with a reduced number of wirings between circuits.

Figure 23C:
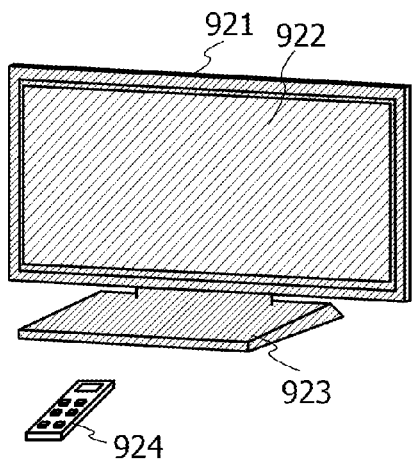

FIG. 23C illustrates a television device including a housing 921, a display portion 922, a stand 923, and the like. The television device can be operated with a switch of the housing 921 and a separate remote controller 924. The electronic component including the semiconductor device of the foregoing embodiment, which functions as a reconfigurable circuit, is mounted on the housing 921 and the remote controller 924. Thus, it is possible to obtain a television device with reduced power consumption and with a reduced number of wirings between circuits.

Figure 23D:
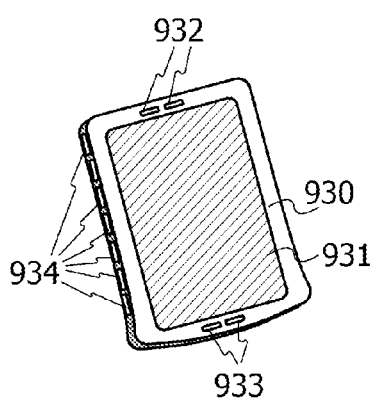

FIG. 23D illustrates a smartphone in which a main body 930 is provided with a display portion 931, a speaker 932, a microphone 933, operation buttons 934, and the like. The electronic component including the semiconductor device of the foregoing embodiment, which functions as a reconfigurable circuit, is provided in the main body 930. Thus, it is possible to obtain a smartphone with reduced power consumption and with a reduced number of wirings between circuits.

Figure 23E:
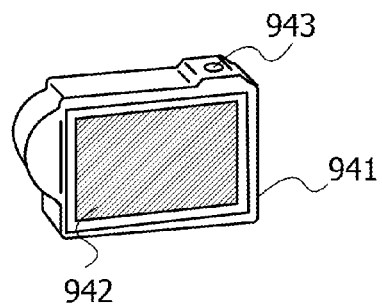

FIG. 23E illustrates a digital camera including a main body 941, a display portion 942, an operation switch 943, and the like. The electronic component including the semiconductor device of the foregoing embodiment, which functions as a reconfigurable circuit, is provided in the main body 941. Thus, it is possible to obtain a digital camera with reduced power consumption and with a reduced number of wirings between circuits.

As described above, the electronic devices shown in this embodiment incorporate the electronic component including the semiconductor device of the foregoing embodiment, which functions as a reconfigurable circuit. Thus, it is possible to obtain an electronic device with reduced power consumption and with a reduced number of wirings between circuits.

(Supplementary Notes on the Description in this Specification and the Like)

The following are notes on the description of the above embodiments and structures in the embodiments.

Notes on One Embodiment of the Present Invention Described in Embodiments

One embodiment of the present invention can be constituted by appropriately combining the structure described in an embodiment with any of the structures described the other embodiments. In addition, in the case where a plurality of structure examples are described in one embodiment, some of the structure examples can be combined as appropriate.

Note that what is described (or part thereof) in an embodiment can be applied to, combined with, or replaced with another content in the same embodiment and/or what is described (or part thereof) in another embodiment or other embodiments.

Note that in each embodiment, a content described in the embodiment is a content described with reference to a variety of diagrams or a content described with text disclosed in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

In each embodiment, one embodiment of the present invention has been described; however, one embodiment of the present invention is not limited to the described embodiment. For example, although an example of using no asynchronous circuit based on a handshaking method has been described as one embodiment of the present invention in Embodiment 1, one embodiment of the present invention is not limited to that example. Depending on circumstances, it is possible to employ an asynchronous circuit based on a handshaking method.

Notes on the Description for Drawings

In this specification and the like, terms for describing arrangement, such as "over" and "under," are used for convenience for describing the positional relation between components with reference to drawings. The positional relation between components is changed as appropriate in accordance with a direction in which each component is described. Thus, terms for describing arrangement are not limited to those used in this specification and can be changed to other terms as appropriate depending on the situation.

The term "over" or "under" does not necessarily mean that a component is placed "directly above and in contact with" or "directly below and in contact with" another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent from each other. However, in an actual circuit and the like, such components are sometimes hard to classify functionally, and there is a case in which one circuit is concerned with a plurality of functions or a case in which a plurality of circuits are concerned with one function. Therefore, blocks in a block diagram do not necessarily show components described in the specification.

In drawings, the size, the layer thickness, or the region is determined arbitrarily for description convenience. Therefore, the size, the layer thickness, or the region is not limited to the illustrated scale. Note that the drawings are schematically shown for clarity, and embodiments of the present invention are not limited to shapes or values shown in the drawings. For example, the following can be included: variation in signal, voltage, or current due to noise or difference in timing.

In drawings such as plan views (also referred to as layout views) and perspective views, some of components might not be illustrated for clarity of the drawings.
<Notes on Expressions that can be Rephrased>

In this specification or the like, in description of connections of a transistor, one of a source and a drain is referred to as "one of a source and a drain" (or a first electrode or a first terminal), and the other of the source and the drain is referred to as "the other of the source and the drain" (or a second electrode or a second terminal). This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as an "electrode" or a "wiring" does not limit a function of a component. For example, an "electrode" is used as part of a "wiring" in some cases, and vice versa. Further, the term "electrode" or "wiring" can also mean a combination of a plurality of "electrodes" and "wirings" formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential." The ground potential does not necessarily mean 0 V. Potentials are relative values, and the potential applied to a wiring or the like is changed depending on the reference potential, in some cases.

In this specification and the like, the terms "film", "layer", and the like can be interchanged with each other depending on the case or circumstances. For example, the term "conductive layer" can be changed into the term "conductive film" in some cases. Also, the term "insulating film" can be changed into the term "insulating layer" in some cases.

NOTES ON DEFINITIONS OF TERMS

The following are definitions of the terms mentioned in the above embodiments.
<<Switch>>

In this specification and the like, a switch is in a conductive state (on state) or in a non-conductive state (off state) to determine whether current flows therethrough or not. Alternatively, a switch has a function of selecting and changing a current path.

Examples of a switch are an electrical switch, a mechanical switch, and the like. That is, any element can be used as a switch as long as it can control current, without limitation to a certain element.

Examples of the electrical switch are a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source and a drain of the transistor are electrically short-circuited. Furthermore, an "off state" of the transistor refers to a state in which the source and the drain of the transistor are electrically disconnected. In the case where a transistor operates just as a switch, the polarity (conductivity type) of the transistor is not particularly limited to a certain type.

An example of a mechanical switch is a switch formed using a micro electro mechanical system (MEMS) technology, such as a digital micromirror device (DMD). Such a switch includes an electrode which can be moved mechanically, and operates by controlling conduction and non-conduction in accordance with movement of the electrode.
<<Channel Length>>

In this specification and the like, the channel length refers to, for example, a distance between a source and a drain in a region where a semiconductor (or a portion where a current flows in a semiconductor when a transistor is on) and a gate overlap with each other or a region where a channel is formed in a plan view of the transistor.

In one transistor, channel lengths in all regions are not necessarily the same. In other words, the channel length of one transistor is not fixed to one value in some cases. Therefore, in this specification, the channel length is any one of values, the maximum value, the minimum value, or the average value, in a region where a channel is formed.

<<Channel Width>>

In this specification and the like, the channel width refers to, for example, the length of a portion where a source and a drain face each other in a region where a semiconductor (or a portion where a current flows in a semiconductor when a transistor is on) and a gate electrode overlap with each other, or a region where a channel is formed.

In one transistor, channel widths in all regions are not necessarily the same. In other words, the channel width of one transistor is not fixed to one value in some cases. Therefore, in this specification, the channel width is any one of values, the maximum value, the minimum value, or the average value, in a region where a channel is formed.

Note that depending on transistor structures, a channel width in a region where a channel is formed actually (hereinafter referred to as an effective channel width) is different from a channel width shown in a plan view of the transistor (hereinafter referred to as an apparent channel width) in some cases. For example, in a transistor having a three-dimensional structure, an effective channel width is greater than an apparent channel width shown in a plan view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the plan view.

In a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, in a plan view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may represent a surrounded channel width or an apparent channel width. Alternatively, in this specification, in the case where the term "channel width" is simply used, it may represent an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

<<Connection>>

In this specification and the like, the expression "A and B are connected" or "A is connected to B" means the case where A and B are electrically connected to each other as well as the case where A and B are directly connected to each other. Here, the expression "A and B are electrically connected" means the case where electric signals can be transmitted and received between A and B when an object having any electric action exists between A and B.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that one embodiment of the present invention is not limited to these expressions which are just examples. Here, each of X, Y, Z1, and Z2 denotes an object (e.g., a device, an element, a circuit, a wiring, an electrode, a terminal, a conductive film, a layer, or the like).

This application is based on Japanese Patent Application serial no. 2014-212710 filed with Japan Patent Office on Oct. 17, 2014 and Japanese Patent Application serial no. 2014-212807 filed with Japan Patent Office on Oct. 17, 2014, the entire contents of which are hereby incorporated by reference.

What is claimed is:

1. A semiconductor device comprising a logic circuit capable of storing configuration data,
    wherein the logic circuit comprises latch circuits, an arithmetic circuit, a delay circuit, and an output timing generation circuit,
    wherein each of the latch circuits is capable of receiving a pulse signal from an adjacent logic circuit and outputting a first signal and a second signal,
    wherein a third signal obtained by a logical operation on the first signals controls power supply to the arithmetic circuit and the delay circuit,
    wherein the arithmetic circuit is capable of receiving the second signals and outputting a fourth signal,
    wherein the second signal is obtained by delaying the first signal in each of the latch circuits,
    wherein the delay circuit is capable of receiving the third signal and outputting a fifth signal,
    wherein the fifth signal is obtained by delaying the third signal so as to correspond to a delay in a critical path of the arithmetic circuit, and
    wherein the output timing generation circuit is capable of receiving a sixth signal obtained by a logical operation on the third signal and the fifth signal and resetting the latch circuits.

2. The semiconductor device according to claim 1, wherein the logic circuit comprises a register and an output signal generation circuit,
    wherein the output timing generation circuit is capable of outputting a seventh signal, an eighth signal, and a ninth signal,
    wherein the register is capable of receiving the fourth signal from the logic circuit and outputting the fourth signal to the output signal generation circuit according to the seventh signal, and
    wherein the output signal generation circuit is capable of outputting the fourth signal to an adjacent logic circuit according to the eighth signal and the ninth signal.

3. The semiconductor device according to claim 1, wherein the arithmetic circuit is capable of switching functions in accordance with the configuration data.

4. The semiconductor device according to claim 1, wherein the configuration data is stored in a memory circuit comprising a transistor containing an oxide semiconductor in a channel formation region.

5. An electronic component comprising:
    the semiconductor device according to claim 1; and
    a lead.

6. An electronic device comprising:
    the electronic component according to claim 5; and
    a display portion, a speaker, a microphone, or an operation button.

7. A semiconductor device comprising a logic circuit capable of storing configuration data,
    wherein the logic circuit comprises latch circuits, multiplexers, an arithmetic circuit, a delay circuit, and an output timing generation circuit,
    wherein each of the latch circuits is capable of receiving a pulse signal from an adjacent logic circuit and outputting a first signal and a second signal,
    wherein a third signal obtained by a logical operation on the first signals controls power supply to the arithmetic circuit and the delay circuit,
    wherein each of the multiplexers is capable of receiving each of the second signals and a binary data signal from an adjacent logic circuit and outputting the second signal or the binary data signal to the arithmetic circuit,
    wherein the second signal is obtained by delaying the first signal in each of the latch circuits,
    wherein the arithmetic circuit is capable of receiving the second signal or the binary data signal and outputting a fourth signal,
    wherein the delay circuit is capable of receiving the third signal and outputting a fifth signal,
    wherein the fifth signal is obtained by delaying the third signal so as to correspond to a delay in a critical path of the arithmetic circuit, and
    wherein the output timing generation circuit is capable of receiving a sixth signal obtained by a logical operation on the third signal and the fifth signal and resetting the latch circuits.

8. The semiconductor device according to claim 7, wherein the logic circuit comprises a register and an output signal generation circuit,
    wherein the output timing generation circuit is capable of outputting a seventh signal, an eighth signal, and a ninth signal,
    wherein the register is capable of receiving the fourth signal from the logic circuit and outputting the fourth signal to the output signal generation circuit according to the seventh signal, and
    wherein the output signal generation circuit is capable of outputting the fourth signal to an adjacent logic circuit according to the eighth signal and the ninth signal.

9. The semiconductor device according to claim 7, wherein the arithmetic circuit is capable of switching functions in accordance with the configuration data.

10. The semiconductor device according to claim 7, wherein the configuration data is stored in a memory circuit comprising a transistor containing an oxide semiconductor in a channel formation region.

11. An electronic component comprising:
    the semiconductor device according to claim 7; and
    a lead.

12. An electronic device comprising:
    the electronic component according to claim 11; and
    a display portion, a speaker, a microphone, or an operation button.

* * * * *

UNITED STATES PATENT AND TRADEMARK OFFICE
CERTIFICATE OF CORRECTION

PATENT NO. : 9,438,207 B2  Page 1 of 1
APPLICATION NO. : 14/882816
DATED : September 6, 2016
INVENTOR(S) : Kurokawa It is certified that error appears in the above-identified patent and that said Letters Patent is hereby corrected as shown below:

In the Specification

Column 6, Line 12, replace "PLE_N[0]" with --PLE_IN[0]--;

Column 9, Line 45, after "signal" replace "N" with --IN--;

Column 9, Line 54, after "signal" replace "N" with --IN--;

Column 9, Line 55, after "signal" replace "N" with --IN--;

Column 9, Line 59, after "signal" replace "N" with --IN--;

Column 9, Line 60, after "signal" replace "N" with --IN--;

Column 9, Line 63, after "signal" replace "N" with --IN--;

Column 9, Line 64, after "signal" replace "N" with --IN--;

Column 10, Line 1, after "signal" replace "N" with --IN--;

Column 18, Line 63, replace "PLE_N[0]" with --PLE_IN[0]--;

Column 28, Line 62, replace "$V_{as}$" with --$V_{ds}$--; and

Column 44, Line 33, after "and X" insert --,--.

Signed and Sealed this
Seventh Day of February, 2017

Michelle K. Lee
*Director of the United States Patent and Trademark Office*